(12) United States Patent
Fukuoka

(10) Patent No.: US 11,211,413 B2
(45) Date of Patent: *Dec. 28, 2021

(54) IMAGING ELEMENT, IMAGING DEVICE, AND MANUFACTURING APPARATUS AND METHOD

(71) Applicant: SONY SEMICONDUCTOR SOLUTIONS CORPORATION, Kanagawa (JP)

(72) Inventor: Shinpei Fukuoka, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/027,486

(22) Filed: Sep. 21, 2020

(65) Prior Publication Data

US 2021/0005654 A1 Jan. 7, 2021

Related U.S. Application Data

(63) Continuation of application No. 15/549,315, filed as application No. PCT/JP2016/054068 on Feb. 12, 2016, now Pat. No. 10,825,850.

(30) Foreign Application Priority Data

Feb. 27, 2015 (JP) ................................ 2015-037564

(51) Int. Cl.
*H01L 27/146* (2006.01)
*H01L 29/10* (2006.01)
(Continued)

(52) U.S. Cl.
CPC ...... *H01L 27/14616* (2013.01); *H01L 27/146* (2013.01); *H01L 27/14689* (2013.01);
(Continued)

(58) Field of Classification Search
CPC ............ H01L 29/7827; H01L 29/7802; H01L 29/78642; H01L 29/4236
See application file for complete search history.

(56) References Cited

U.S. PATENT DOCUMENTS 10,825,850 B2 * 11/2020 Fukuoka ............... H01L 29/105
2006/0237781 A1* 10/2006 Marchant .......... H01L 29/42368
257/330
(Continued)

FOREIGN PATENT DOCUMENTS

CN 104282701 1/2015

*Primary Examiner* — Wasiul Haider
(74) *Attorney, Agent, or Firm* — Sheridan Ross P.C.

(57) ABSTRACT

The present technology relates to an imaging element, an imaging device, and a manufacturing apparatus and a method that facilitate electric charge transfer. An imaging element of the present technology includes a vertical transistor that has a potential with a gradient in at least part of a charge transfer channel that transfers electric charge of a photoelectric conversion unit. Also, an imaging device of the present technology includes: an imaging element including a vertical transistor that has a potential with a gradient in at least part of a charge transfer channel that transfers electric charge of a photoelectric conversion unit; and an image processing unit that performs image processing on captured image data obtained by the imaging element. Further, a manufacturing apparatus of the present technology includes a vertical transistor manufacturing unit that manufactures a vertical transistor having a potential with a gradient in at least part of a charge transfer channel that transfers electric charge of a photoelectric conversion unit. The present technology can be applied to imaging elements, imaging devices, and manufacturing apparatuses and methods, for example.

20 Claims, 22 Drawing Sheets

(51) Int. Cl.
*H01L 29/423* (2006.01)
*H01L 29/78* (2006.01)

(52) U.S. Cl.
CPC ........ *H01L 29/105* (2013.01); *H01L 29/4236* (2013.01); *H01L 29/42368* (2013.01); *H01L 29/7827* (2013.01)

(56) References Cited

U.S. PATENT DOCUMENTS

| | | | | |
|---|---|---|---|---|
| 2009/0303371 | A1* | 12/2009 | Watanabe | H01L 27/14641 |
| | | | | 348/311 |
| 2010/0314672 | A1* | 12/2010 | Manda | H01L 29/7813 |
| | | | | 257/292 |
| 2013/0015513 | A1* | 1/2013 | Kido | H01L 27/14627 |
| | | | | 257/292 |

* cited by examiner

IMAGING ELEMENT, IMAGING DEVICE, AND MANUFACTURING APPARATUS AND METHOD

CROSS REFERENCE TO RELATED APPLICATIONS

This application is a continuation of U.S. patent application Ser. No. 15/549,315, filed Aug. 7, 2017, which claims the benefit of PCT Application No. PCT/JP2016/054068 having an international filing date of Feb. 12, 2016, which designated the United States, which PCT application claimed the benefit of Japanese Patent Application No. 2015-037564 filed Feb. 27, 2015 the entire disclosures of each of which are incorporated herein by reference.

TECHNICAL FIELD

The present technology relates to imaging elements, imaging devices, and manufacturing apparatuses and methods, and more particularly, to an imaging element, an imaging device, and a manufacturing apparatus and a method that are designed to transfer electric charge more easily.

BACKGROUND ART

There are conventional imaging elements each including a vertical transistor that reads a signal photoelectrically converted by a photoelectric conversion unit (see Patent Document 1, for example).

CITATION LIST

Patent Document

Patent Document 1: Japanese Patent Application Laid-Open No. 2010-114324

SUMMARY OF THE INVENTION

Problems to be Solved by the Invention

However, in the vertical transistor disclosed in Patent Document 1, the potential of the charge transfer channel is uniform. Therefore, the greater the length of the gate portion of the vertical transistor, the longer the distance over which electric charge is transferred. As a result, it might be difficult to read the electric charge.

The present technology has been suggested in view of those circumstances, and aims to facilitate electric charge transfer.

Solutions to Problems

One aspect of the present technology is an imaging element that includes a vertical transistor having a potential with a gradient in at least part of a charge transfer channel that transfers electric charge of a photoelectric conversion unit.

The potential may have a gradient in a charge transfer direction in the charge transfer channel. The gradient becomes deeper in the direction toward the transfer destination of the electric charge.

The charge transfer channel may be a charge transfer channel of a first conductivity type that transfers the electric charge of the photoelectric conversion unit of a second conductivity type, the photoelectric conversion unit being formed in a semiconductor of the first conductivity type. A gate insulating film may be formed between the charge transfer channel and a gate electrode so that the thickness of the gate insulating film becomes gradually smaller in the direction toward the transfer destination of the electric charge.

The charge transfer channel may be a charge transfer channel of a first conductivity type that transfers the electric charge of the photoelectric conversion unit of a second conductivity type, the photoelectric conversion unit being formed in a semiconductor of the first conductivity type. A gate insulating film may be formed between the charge transfer channel and a gate electrode so that the thickness of the gate insulating film becomes smaller in a stepwise fashion in the direction toward the transfer destination of the electric charge.

The charge transfer channel may be a charge transfer channel of a first conductivity type that transfers the electric charge of the photoelectric conversion unit of a second conductivity type, the photoelectric conversion unit being formed in a semiconductor of the first conductivity type. The charge transfer channel may be formed so as to have an impurity concentration that becomes lower in the direction toward the transfer destination of the electric charge.

The charge transfer channel may be a charge transfer channel of a second conductivity type that transfers the electric charge of the photoelectric conversion unit of the second conductivity type, the photoelectric conversion unit being formed in a semiconductor of a first conductivity type. A gate insulating film may be formed between the charge transfer channel and a gate electrode so that the thickness of the gate insulating film becomes gradually greater in the direction toward the transfer destination of the electric charge.

The charge transfer channel may be a charge transfer channel of a second conductivity type that transfers the electric charge of the photoelectric conversion unit of the second conductivity type, the photoelectric conversion unit being formed in a semiconductor of a first conductivity type. A gate insulating film may be formed between the charge transfer channel and a gate electrode so that the thickness of the gate insulating film becomes greater in a stepwise fashion in the direction toward the transfer destination of the electric charge.

The charge transfer channel may be a charge transfer channel of a second conductivity type that transfers the electric charge of the photoelectric conversion unit of the second conductivity type, the photoelectric conversion unit being formed in a semiconductor of a first conductivity type. The charge transfer channel may be formed so as to have an impurity concentration that becomes higher in the direction toward the transfer destination of the electric charge.

The potential may have a gradient in a rotational direction along a gate electrode in the charge transfer channel.

The thickness of a gate insulating film formed between the charge transfer channel and the gate electrode may vary in the rotational direction.

The impurity concentration in the charge transfer channel may vary in the rotational direction.

Another aspect of the present technology is an imaging device that includes: an imaging element including a vertical transistor that has a potential with a gradient in at least part of a charge transfer channel that transfers electric charge of a photoelectric conversion unit; and an image processing unit that performs image processing on captured image data obtained by the imaging element.

Yet another aspect of the present technology is a manufacturing apparatus that manufactures an imaging element, and include a vertical transistor manufacturing unit that manufactures a vertical transistor having a potential with a gradient in at least part of a charge transfer channel that transfers electric charge of a photoelectric conversion unit.

The vertical transistor manufacturing unit may include: an etching unit that forms a groove by etching a semiconductor substrate; a conductive impurity implantation unit that implants a conductive impurity into the groove formed by the etching unit; a gate insulating film formation unit that forms a gate insulating film in the groove, the gate insulating film having a thickness corresponding to a hierarchical level in the groove; a gate insulating film removal unit that removes the gate insulating film formed by the gate insulating film formation unit, until reaching a depth corresponding to the hierarchical level; and a gate electrode formation unit that forms a gate electrode in a groove formed in the gate insulating film. The vertical transistor manufacturing unit may form the gate insulating film having a thickness that varies in a stepwise fashion in the direction toward the transfer destination of the electric charge, by repeating the formation of the gate insulating film with the gate insulating film formation unit and the removal of the gate insulating film with the gate insulating film removal unit.

The vertical transistor manufacturing unit may include: an etching unit that forms a groove by etching a semiconductor substrate; a conductive impurity implantation unit that implants a conductive impurity into the groove formed by the etching unit; a gate insulating film formation unit that forms a gate insulating film in the groove; a gate insulating film processing unit that forms a mesa-type groove in the gate insulating film formed by the gate insulating film formation unit; and a gate electrode formation unit that forms a gate electrode in the mesa-type groove formed by the gate insulating film processing unit.

The vertical transistor manufacturing unit may include: an etching unit that forms a groove by etching a semiconductor substrate; a conductive impurity implantation unit that implants a conductive impurity into the groove formed by the etching unit; a non-conductive impurity implantation unit that implants a non-conductive impurity into the groove formed by the etching unit, the non-conductive impurity being implanted at a concentration corresponding to a depth; a gate insulating film formation unit that forms a gate insulating film in the groove; and a gate electrode formation unit that forms a gate electrode in a groove formed in the gate insulating film.

The vertical transistor manufacturing unit may include: an etching unit that forms a groove by etching a semiconductor substrate; a conductive impurity implantation unit that implants a conductive impurity into the groove formed by the etching unit, the conductive impurity being implanted at a concentration corresponding to a depth; a gate insulating film formation unit that forms a gate insulating film in the groove; and a gate electrode formation unit that forms a gate electrode in a groove formed in the gate insulating film.

The vertical transistor manufacturing unit may include: an etching unit that forms a groove by etching a semiconductor substrate; a conductive impurity implantation unit that implants a conductive impurity into the groove formed by the etching unit; a gate insulating film formation unit that forms a gate insulating film in the groove; a gate insulating film processing unit that forms a groove in the gate insulating film formed by the gate insulating film formation unit, the thickness of the gate insulating film varying in a rotational direction along a gate electrode; and a gate electrode formation unit that forms the gate electrode in the groove formed by the gate insulating film processing unit.

The vertical transistor manufacturing unit may include: an etching unit that forms a groove by etching a semiconductor substrate; a conductive impurity implantation unit that implants a conductive impurity into the groove formed by the etching unit, the conductive impurity being implanted at a concentration corresponding to a position in a rotational direction along a gate electrode; a gate insulating film formation unit that forms a gate insulating film in the groove; and a gate electrode formation unit that forms the gate electrode in a groove formed in the gate insulating film.

Still another aspect of the present technology is a manufacturing method implemented in a manufacturing apparatus that manufactures an imaging element. The manufacturing method includes manufacturing a vertical transistor having a potential with a gradient in at least part of a charge transfer channel that transfers electric charge of a photoelectric conversion unit.

One aspect of the present technology includes a vertical transistor having a potential with a gradient in at least part of a charge transfer channel that transfers electric charge of a photoelectric conversion unit.

Another aspect of the present technology includes: an imaging element including a vertical transistor that has a potential with a gradient in at least part of a charge transfer channel that transfers electric charge of a photoelectric conversion unit; and an image processing unit that performs image processing on captured image data obtained by the imaging element.

Yet another aspect of the present technology relates to manufacturing of a vertical transistor that has a potential with a gradient in at least part of a charge transfer channel that transfers electric charge of a photoelectric conversion unit.

Effects of the Invention

According to the present technology, an object can be imaged. Further, according to the present technology, electric charge transfer can be facilitated.

MODES FOR CARRYING OUT THE INVENTION

The following is a description of modes for carrying out the present disclosure (hereinafter referred to as embodiments). It should be noted that explanation will be made in the following order.

1. First Embodiment (Imaging Element)
2. Second Embodiment (Manufacturing Apparatus)
3. Third Embodiment (Imaging Device)
4. Example Applications

1. First Embodiment

Image Sensor Having Vertical Transistors

There are conventional imaging elements each including a vertical transistor that reads a signal photoelectrically converted by a photoelectric conversion unit, like the image sensor disclosed in Patent Document 1, for example.

However, in the vertical transistor used in the image sensor disclosed in Patent Document 1, the potential of the charge transfer channel is uniform. Therefore, the greater the length of the gate portion of the vertical transistor, the longer the distance over which electric charge is transferred. As a result, it might be difficult to read the electric charge.

Potential Gradient in a Charge Transfer Channel

To counter this, in the imaging element, a vertical transistor is used as a transfer transistor that controls reading of electric charge from a photoelectric conversion unit, and the potential has a gradient in at least part of the charge transfer channel of the vertical transistor that transfers electric charge.

With this structure, electric charge transfer can be facilitated in the charge transfer channel. Thus, an increase in noise can be prevented or reduced, and degradation of the quality of each captured image obtained by the imaging element can be prevented or reduced.

Structure of the Pixel Region of an Image Sensor

Figure 1:
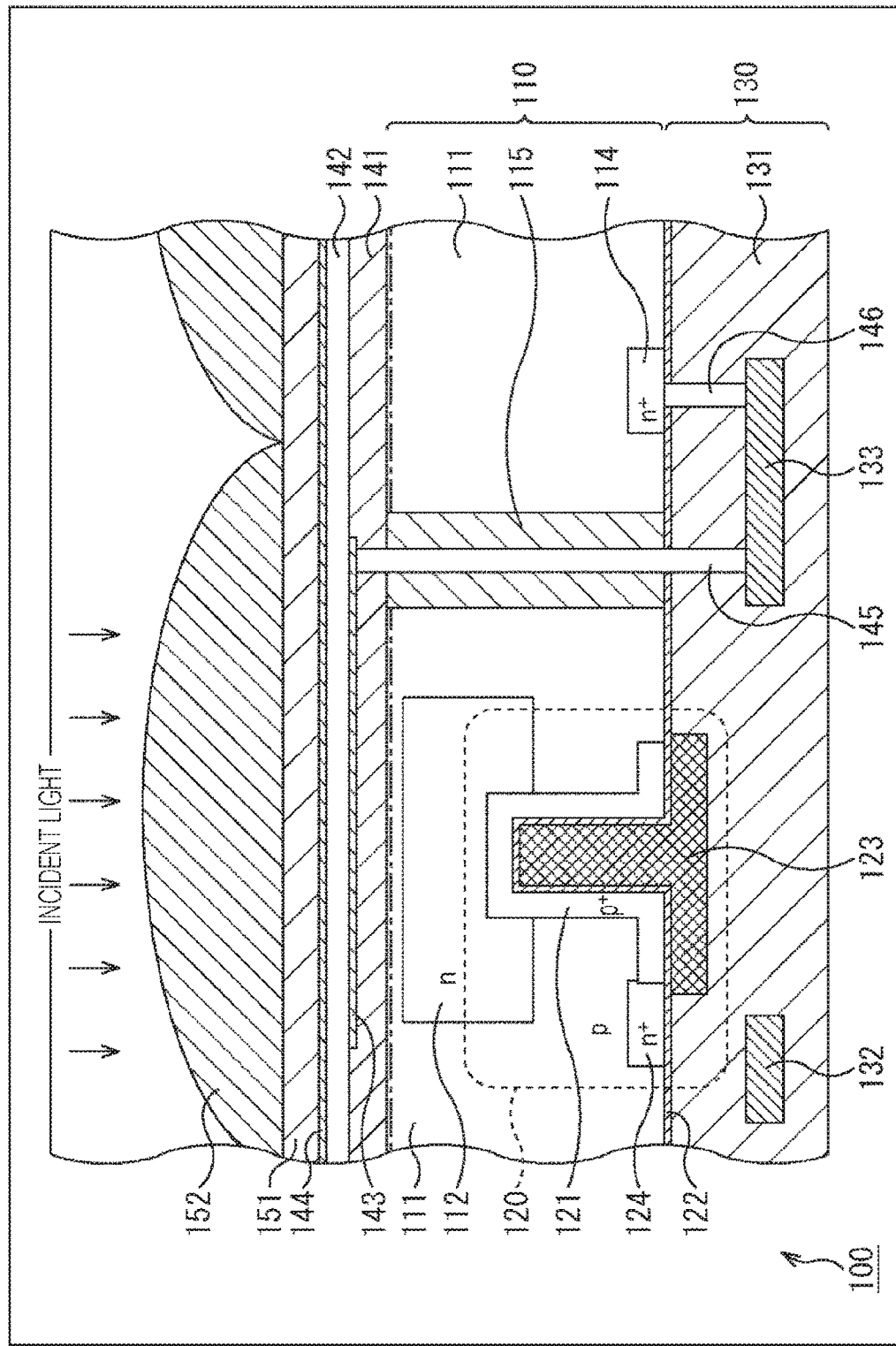
FIG. 1 is a cross-sectional view of an example structure of part of an imaging element.

FIG. 1 is a cross-sectional view of a typical example structure of the pixel region of an image sensor that is an embodiment of an imaging element according to the present technology. The image sensor 100 shown in FIG. 1 is a back-illuminated complementary metal oxide semiconductor (CMOS) image sensor that images an object and obtains a captured image as an electric signal. The image sensor 100 has a pixel region formed with pixels that are arranged in an array or in a plane, for example. Light incident on each pixel of the pixel region is photoelectrically converted, and thus, pixel signals of a captured image are obtained. In FIG. 1, an example of the stack structure of part of the pixel region of the image sensor 100 is shown as a cross-sectional view. In FIG. 1, the stack structure is schematically shown, for ease of explanation. Also, in FIG. 1, the components irrelevant to the description of the present technology are simplified or are not explained herein.

As shown in FIG. 1, the image sensor 100 includes a semiconductor substrate layer 110. This semiconductor substrate layer 110 is formed with a semiconductor substrate 111 of a first conductivity type (p-type, for example), and various components formed in the semiconductor substrate 111. The image sensor 100 shown in FIG. 1 is a back-illuminated image sensor. The lower side in the drawing is the front surface side of the semiconductor substrate 111, and the upper side in the drawing is the back surface side of the semiconductor substrate 111.

For example, a photoelectric conversion unit (a photodiode, for example) 112 is formed in the semiconductor substrate 111. The photoelectric conversion unit 112 is of a second conductivity type (n-type, for example). The photoelectric conversion unit 112 photoelectrically converts light entering from the back surface side (or the upper side in the drawing) of the semiconductor substrate, and stores the obtained electric charge.

In addition, a floating diffusion layer 114, an insulating film 115, and the like are also formed in the semiconductor substrate 111. The floating diffusion layer 114 is formed on the front side of the semiconductor substrate 111, and is of the second conductivity type ($n^+$-type, for example). The floating diffusion layer 114 stores electric charge transferred from an organic photoelectric conversion film 142 that will be described later. The insulating film 115 is designed to penetrate through the semiconductor substrate 111 in the depth direction.

In addition, a transfer transistor 120 is also formed in the semiconductor substrate 111. The transfer transistor 120 is a transistor that controls the transfer of the electric charge stored in the photoelectric conversion unit 112 to a floating diffusion layer 124, and is formed as a vertical transistor. The gate portion of the transfer transistor 120 is designed to extend from the front side of the semiconductor substrate 111 to the photoelectric conversion unit 112. The photoelectric conversion unit 112 is formed as the source of the transfer transistor 120.

The transfer transistor 120 includes a charge transfer channel 121, a gate insulating film 122, a gate electrode 123, and the floating diffusion layer 124, for example. Components other than these may of course be formed in the semiconductor substrate 111.

The charge transfer channel 121 is designed as the gate portion of the transfer transistor 120, and is of the first conductivity type ($p^+$-type, for example). The charge transfer channel 121 is connected to both the photoelectric conversion unit 112 and the floating diffusion layer 124. When an electric field is applied to the charge transfer channel 121 (in accordance with the potential of the gate electrode 123), the electric charge in the photoelectric conversion unit 112 is transferred to the floating diffusion layer 124 via the charge transfer channel 121.

The gate insulating film 122 is formed on the inner side of the charge transfer channel 121, and is a layer that is formed with an insulating material and electrically insulates the charge transfer channel 121 and the gate electrode 123 from each other.

The gate electrode 123 is an electrode to which a gate potential is applied, and is formed on the inner side of the gate insulating film 122. The gate electrode 123 is formed with a conductor such as a metal.

The floating diffusion layer 124 is formed on the front side of the semiconductor substrate 111. For example, the floating diffusion layer 124 is of the second conductivity type ($n^+$-type, for example). The floating diffusion layer 124 is formed as the drain of the transfer transistor 120. The floating diffusion layer 124 stores the electric charge transferred from the photoelectric conversion unit 112.

An interconnect layer 130 is formed on the front side of the semiconductor substrate layer 110. In the interconnect layer 130, an interconnect interlayer film 131 and interconnect lines such as an interconnect line 132 and an interconnect line 133 are formed. The interconnect interlayer film 131 is a layer that is formed with an insulating material and electrically insulates wires formed with a conductor such as a metal from each other.

It should be noted that the interconnect line 132 and the interconnect line 133 are examples of the interconnect lines formed in the interconnect layer 130, and interconnect lines other than the interconnect line 132 and the interconnect line 133 are also formed in the interconnect layer 130 in practice. For example, the gate electrode 123 is connected to an interconnect line (such as a control line; not shown) via a contact or the like (not shown). The gate electrode 123 has a potential corresponding to a signal supplied via the control line (an electric field corresponding to the signal is applied to the charge transfer channel 121).

Also, the floating diffusion layer 124 is connected to an interconnect line (not shown) via a contact or the like (not shown), for example. Likewise, the floating diffusion layer 114 is connected to an interconnect line (not shown) via a contact or the like (not shown), for example. The electric charges stored in the floating diffusion layer 114 and the floating diffusion layer 124 are supplied to the gate of an amplification transistor or the like (not shown) via the interconnect lines, for example.

An insulating film 141 and the organic photoelectric conversion film 142 are stacked on the back surface side of the semiconductor substrate layer 110. A lower transparent electrode 143 is formed on the front surface side of the organic photoelectric conversion film 142 in the vicinity of the photoelectric conversion unit 112. Further, an upper transparent electrode 144 is formed on the back surface side of the organic photoelectric conversion film 142. The lower transparent electrode 143 is connected to the interconnect line 133 via a through electrode 145 formed in the insulating film 115. The floating diffusion layer 114 is also connected to the interconnect line 133 via a contact 146. That is, the organic photoelectric conversion film 142 is connected to the floating diffusion layer 114 via the lower transparent electrode 143, the through electrode 145, the interconnect line 133, and the contact 146. The electric charge obtained by the organic photoelectric conversion film 142 photoelectrically converting incident light is supplied to the floating diffusion layer 114 via the lower transparent electrode 143, the through electrode 145, the interconnect line 133, and the contact 146.

A passivation layer 151 is formed on the back surface side of the upper transparent electrode 144. The passivation layer 151 is made of SiN or the like, for example, and protects the respective layers (such as the upper transparent electrode 144) located on the front surface side of the passivation layer 151.

On-chip lenses 152 that gather incident light entering each pixel onto the photoelectric conversion unit 112 and the like is formed on the back surface side of the passivation layer 151.

Potential Gradient in the Charge Transfer Direction

Figure 2:
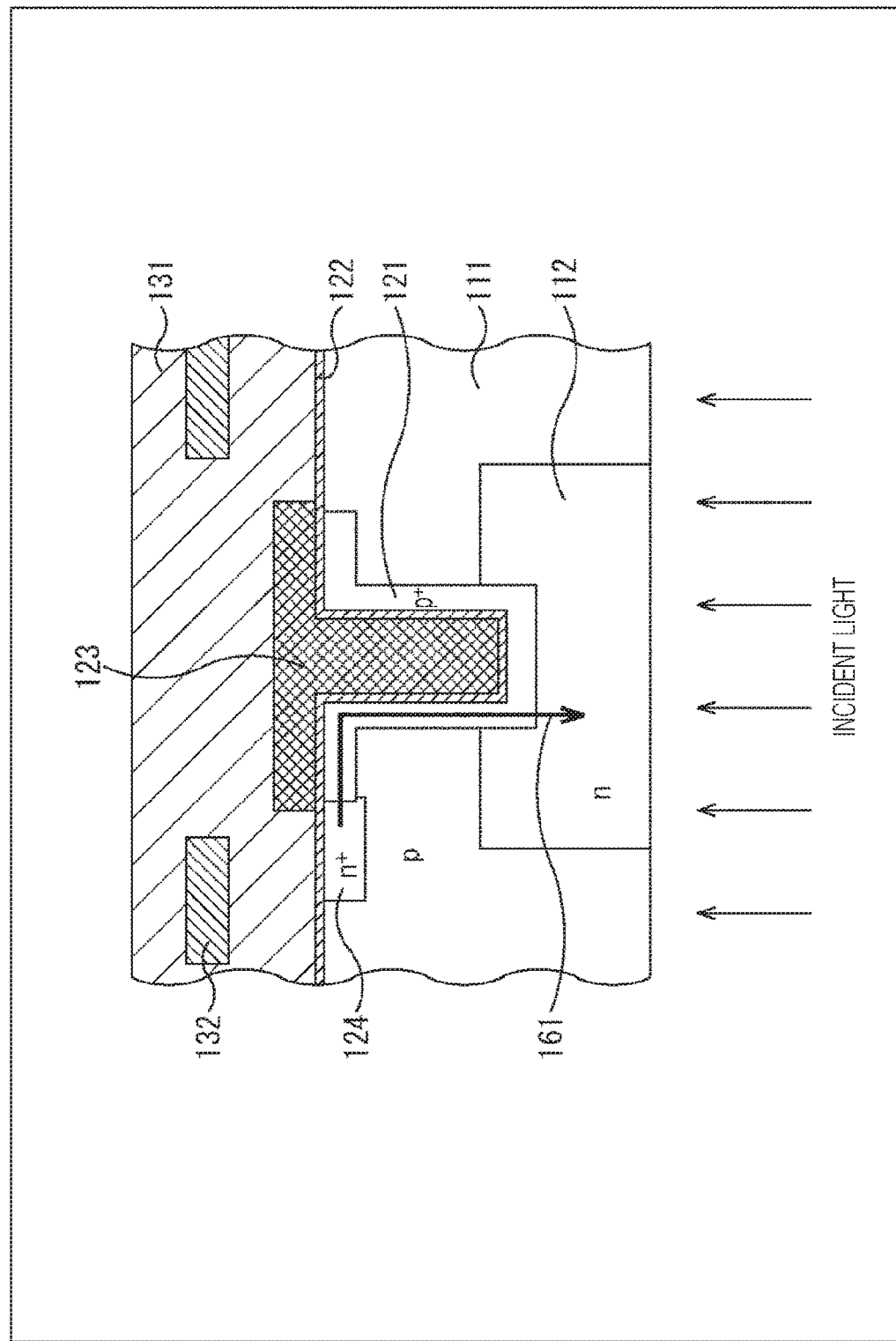
FIG. 2 is a cross-sectional view of an example structure of part of a vertical transistor.

In the image sensor 100 including pixels each having the above structure, a potential gradient that becomes deeper in the direction toward the charge transfer destination may be formed in the charge transfer direction (the opposite direction from the direction indicated by an arrow 161 in FIG. 2) in the charge transfer channel 121, as shown in FIG. 2, for example.

It should be noted that, since the transfer transistor 120 is a vertical transistor, the charge transfer direction is the depth direction of the semiconductor substrate 111 (the direction from the bottom toward the top in the drawing) at the portion of the charge transfer channel 121 equivalent to the sidewall portion of the gate electrode 123, for example, as shown in FIG. 2.

Figure 3:
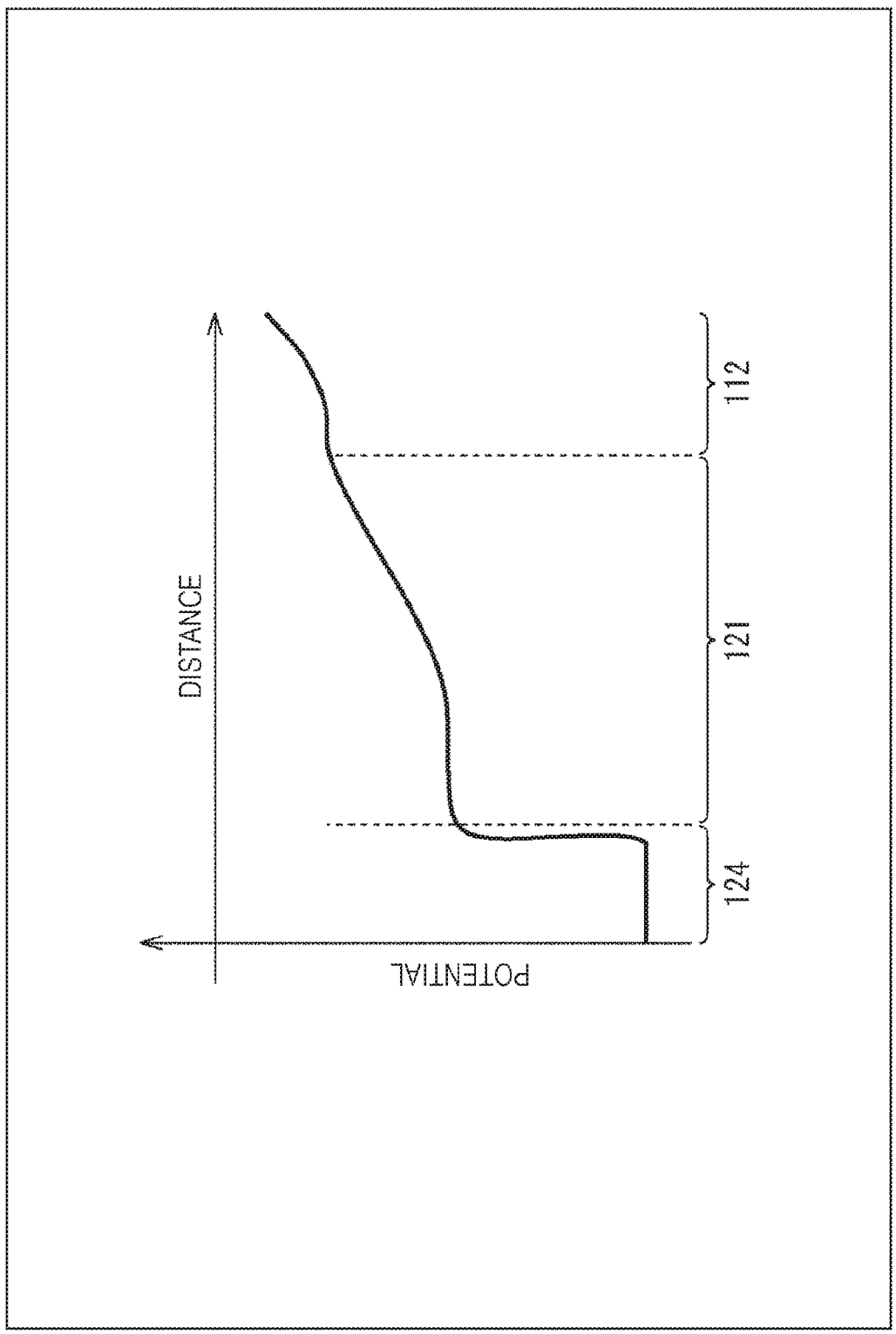
FIG. 3 is a graph for explaining a potential gradient.

FIG. 3 shows an example of the distribution of the potential in the direction from the floating diffusion layer 124 toward the photoelectric conversion unit 112 via the charge transfer channel 121, as indicated by the arrow 161 in FIG. 2. In the graph shown in FIG. 3, the abscissa axis indicates each position of the arrow 161, and the ordinate axis indicates the depth of the potential. As shown in the graph in FIG. 3, the potential of the charge transfer channel 121 is deeper at a position closer to the floating diffusion layer 124 in the direction of the arrow 161. That is, the potential has a gradient at least at part of the charge transfer channel 121.

As a potential gradient that becomes deeper in the direction toward the charge transfer destination is formed in the charge transfer direction as described above, the charge transfer from the photoelectric conversion unit 112 to the floating diffusion layer 124 can be made easier.

Gate Insulating Film Thickness Control 1

Next, a specific example of formation of the above described potential gradient in the charge transfer direction is described. The gate insulating film may be formed so that the thickness thereof becomes gradually smaller in the direction toward the charge transfer destination. For example, as shown in FIG. 4, the gate insulating film 122 may be formed so that the thickness thereof becomes gradually smaller in the direction toward the charge transfer destination (the floating diffusion layer 124).

Figure 4:
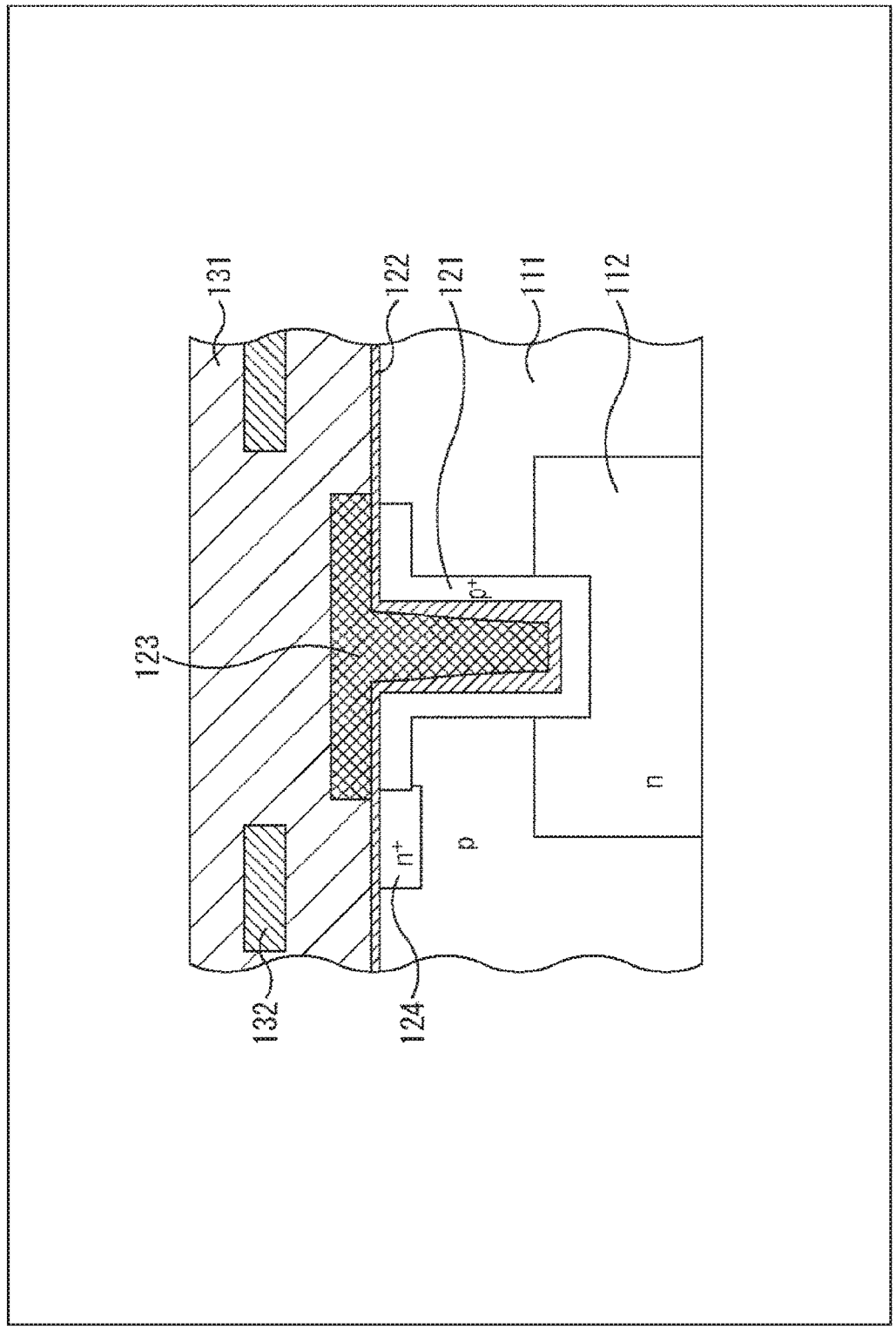
FIG. 4 is a cross-sectional view of an example structure of part of a vertical transistor.

In the example shown in FIG. 4, the gate electrode 123 is formed so as to become gradually thicker in the direction toward the charge transfer destination (or is formed so as to become gradually thinner in the depth direction of the semiconductor substrate 111 toward the back surface side), and the thickness of the gate insulating film 122 becomes gradually smaller accordingly in the direction toward the charge transfer destination.

In this manner, the electric field to be applied to the charge transfer channel 121 can be made to become stronger in the direction toward the floating diffusion layer 124. Accordingly, in the charge transfer channel 121 (particularly at the portion of the charge transfer channel 121 equivalent to the sidewall portion of the gate electrode 123), the potential can be made to become deeper in the direction toward the floating diffusion layer 124, as in the example shown in FIG. 3. Thus, the electric charge transfer from the photoelectric conversion unit 112 to the floating diffusion layer 124 can be facilitated.

Gate Insulating Film Thickness Control 2

Alternatively, the gate insulating film may be formed so that the thickness thereof becomes smaller in a stepwise fashion in the direction toward the charge transfer destination. For example, as shown in FIG. 5, the gate insulating film 122 may be formed so that the thickness thereof becomes smaller in a stepwise fashion in the direction toward the charge transfer destination (the floating diffusion layer 124).

Figure 5:
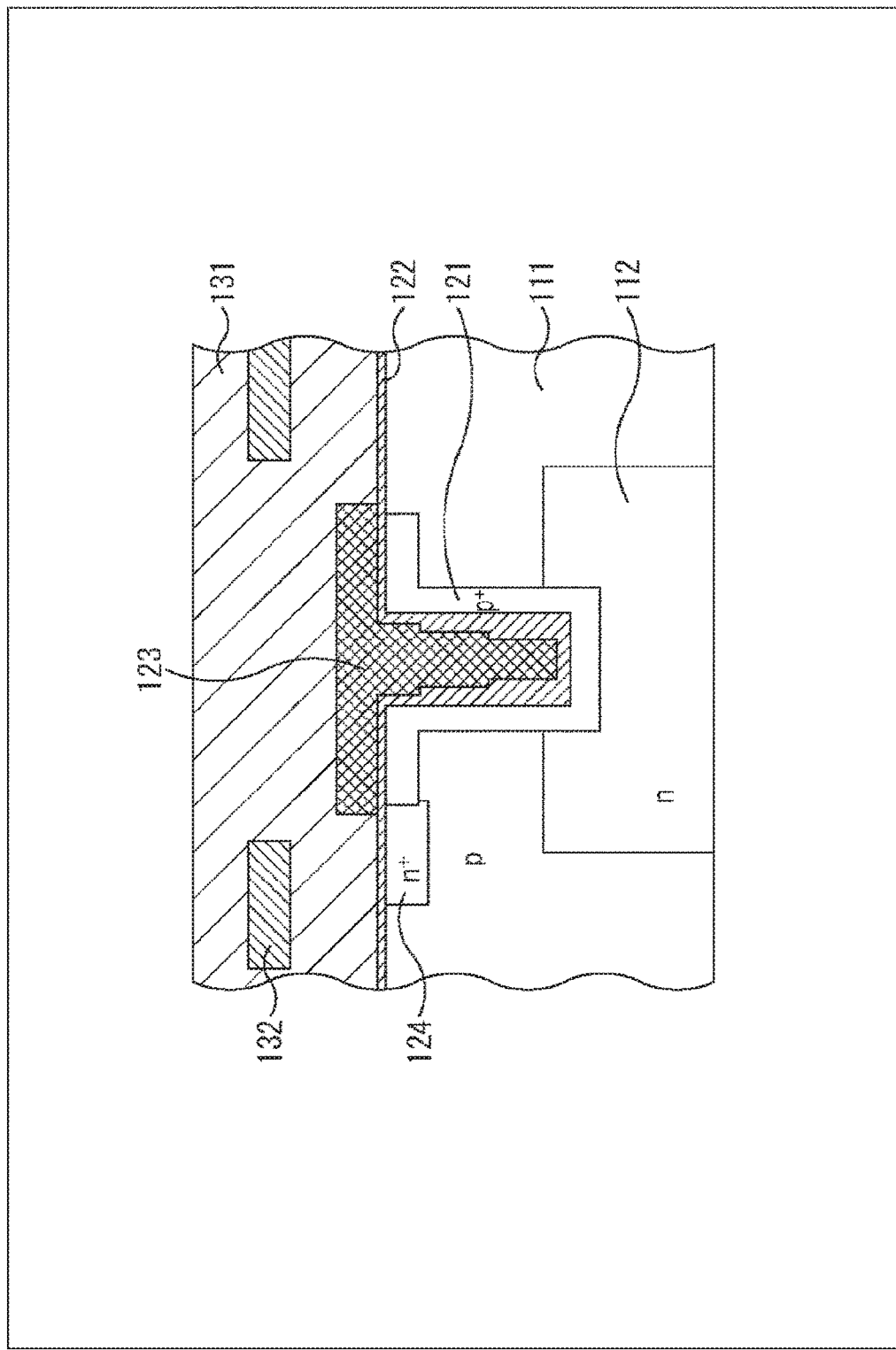
FIG. 5 is a cross-sectional view of an example structure of part of a vertical transistor.

In the example shown in FIG. 5, the gate electrode 123 is formed so as to become thicker in a stepwise fashion in the direction toward the charge transfer destination (or is formed so as to become thinner in a stepwise fashion in the depth direction of the semiconductor substrate 111 toward the back surface side), and the thickness of the gate insulating film 122 becomes smaller accordingly in a stepwise fashion in the direction toward the charge transfer destination.

In this manner, the electric field to be applied to the charge transfer channel 121 can be made to become stronger in the direction toward the floating diffusion layer 124. Accordingly, in the charge transfer channel 121 (particularly at the portion of the charge transfer channel 121 equivalent to the sidewall portion of the gate electrode 123), the potential can be made to become deeper in the direction toward the floating diffusion layer 124, as in the example shown in FIG. 3. Thus, the electric charge transfer from the photoelectric conversion unit 112 to the floating diffusion layer 124 can be facilitated.

Gate Insulating Film Thickness Control 3

Figure 6:
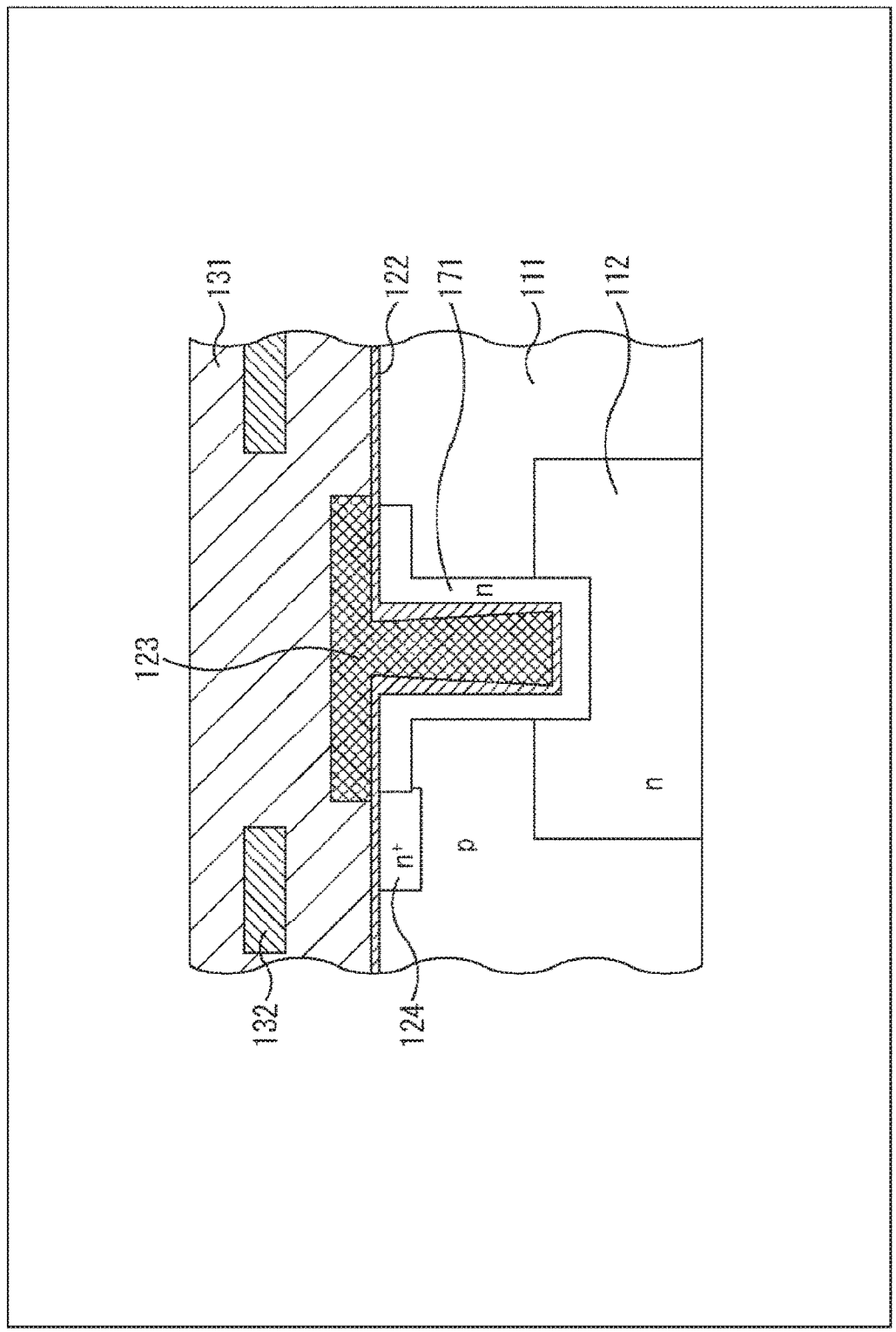
FIG. 6 is a cross-sectional view of an example structure of part of a vertical transistor.

It should be noted that the charge transfer channel of the transfer transistor may be of the second conductivity type (n-type, for example). For example, as shown in FIG. 6, a charge transfer channel 171 of the transfer transistor 120 may be of the second conductivity type (n-type, for example). In the case of the image sensor 100 in the example shown in FIG. 6, the charge transfer channel 171 is formed, instead of the charge transfer channel 121. The charge transfer channel 171 is designed as the gate portion of the transfer transistor 120, and is of the second conductivity type (n-type, for example), for example. The charge transfer channel 171 is connected to both the photoelectric conversion unit 112 and the floating diffusion layer 124. When an electric field is applied to the charge transfer channel 171 (in accordance with the potential of the gate electrode 123), the electric charge in the photoelectric conversion unit 112 is transferred to the floating diffusion layer 124 via the charge transfer channel 171.

In the transfer transistor having such a charge transfer channel of the second conductivity type (n-type, for example), the gate insulating film may be formed so that the thickness thereof becomes gradually greater in the direction toward the charge transfer destination. For example, as shown in FIG. 6, the gate insulating film 122 may be formed so that the thickness thereof becomes gradually greater in the direction toward the charge transfer destination (the floating diffusion layer 124) in the transfer transistor 120.

In the example shown in FIG. 6, the gate electrode 123 is formed so as to become gradually thinner in the direction toward the charge transfer destination (or is formed so as to become gradually thicker in the depth direction of the semiconductor substrate 111 toward the back surface side), and the thickness of the gate insulating film 122 becomes gradually greater accordingly in the direction toward the charge transfer destination.

In this manner, the electric field to be applied to the charge transfer channel 171 can be made to become stronger in the direction toward the floating diffusion layer 124. Accordingly, in the charge transfer channel 171 (particularly at the portion of the charge transfer channel 171 equivalent to the sidewall portion of the gate electrode 123), the potential can be made to become deeper in the direction toward the floating diffusion layer 124, as in the example shown in FIG. 3. Thus, the electric charge transfer from the photoelectric conversion unit 112 to the floating diffusion layer 124 can be facilitated.

Gate Insulating Film Thickness Control 4

Alternatively, the gate insulating film may be formed so that the thickness thereof becomes greater in a stepwise fashion in the direction toward the charge transfer destination. For example, as shown in FIG. 7, the gate insulating film 122 may be formed so that the thickness thereof becomes greater in a stepwise fashion in the direction toward the charge transfer destination (the floating diffusion layer 124).

Figure 7:
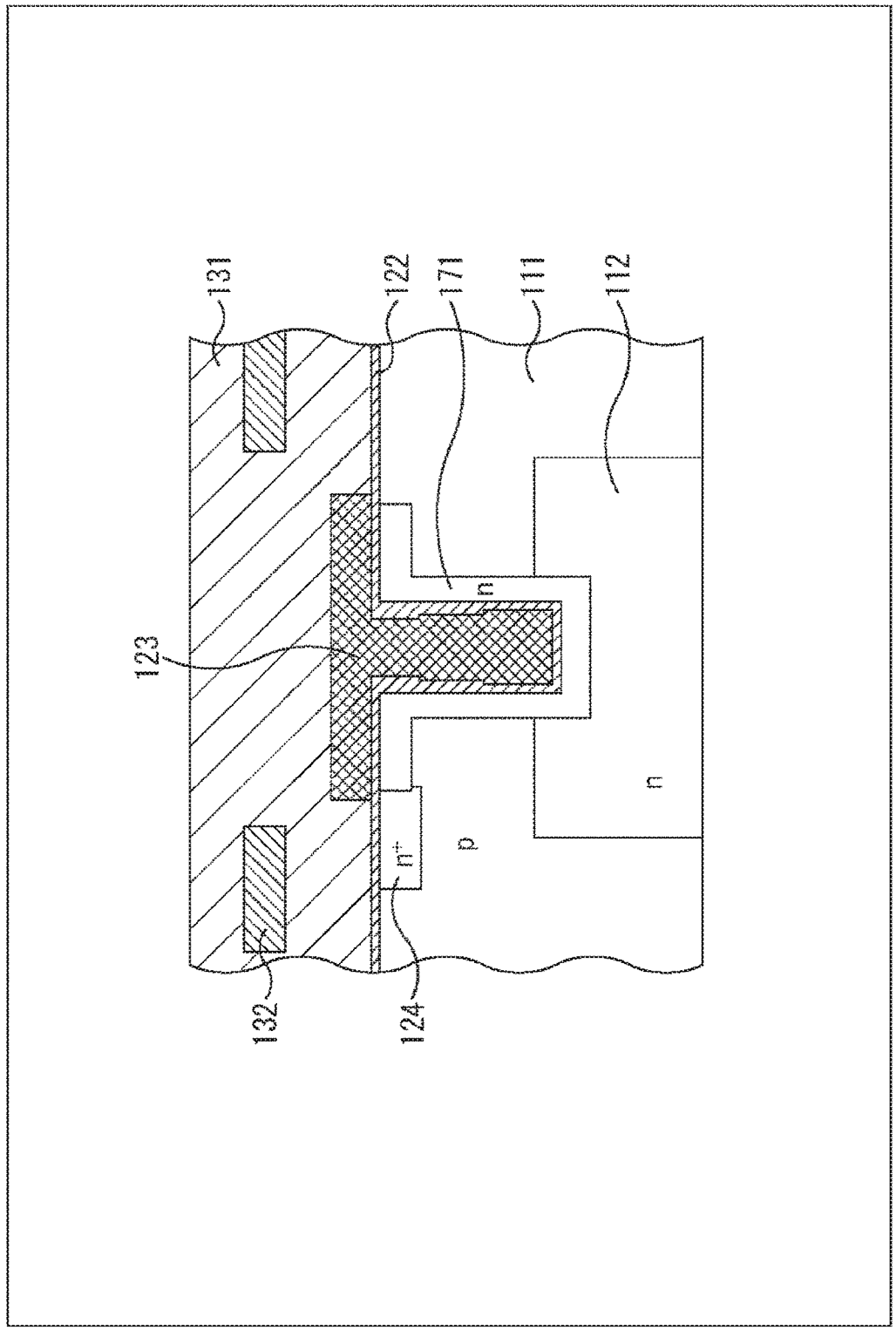
FIG. 7 is a cross-sectional view of an example structure of part of a vertical transistor.

In the example shown in FIG. 7, the gate electrode 123 is formed so as to become thinner in a stepwise fashion in the direction toward the charge transfer destination (or is formed so as to become thicker in a stepwise fashion in the depth direction of the semiconductor substrate 111 toward the back surface side), and the thickness of the gate insulating film 122 becomes greater accordingly in a stepwise fashion in the direction toward the charge transfer destination.

In this manner, the electric field to be applied to the charge transfer channel 171 can be made to become stronger in the direction toward the floating diffusion layer 124. Accordingly, in the charge transfer channel 171 (particularly at the portion of the charge transfer channel 171 equivalent to the sidewall portion of the gate electrode 123), the potential can be made to become deeper in the direction toward the floating diffusion layer 124, as in the example shown in FIG. 3. Thus, the electric charge transfer from the photoelectric conversion unit 112 to the floating diffusion layer 124 can be facilitated.

Charge Transfer Channel Impurity Concentration Control

In addition, in a case where the charge transfer channel of the transfer transistor is of the first conductivity type (p-type, for example), the charge transfer channel may also be formed so that the impurity concentration therein becomes lower in the direction toward the charge transfer destination. For example, as shown in FIG. 8, the concentration of the impurities implanted into the charge transfer channel 121 may become lower in the direction toward the charge transfer destination (the floating diffusion layer 124).

Figure 8:
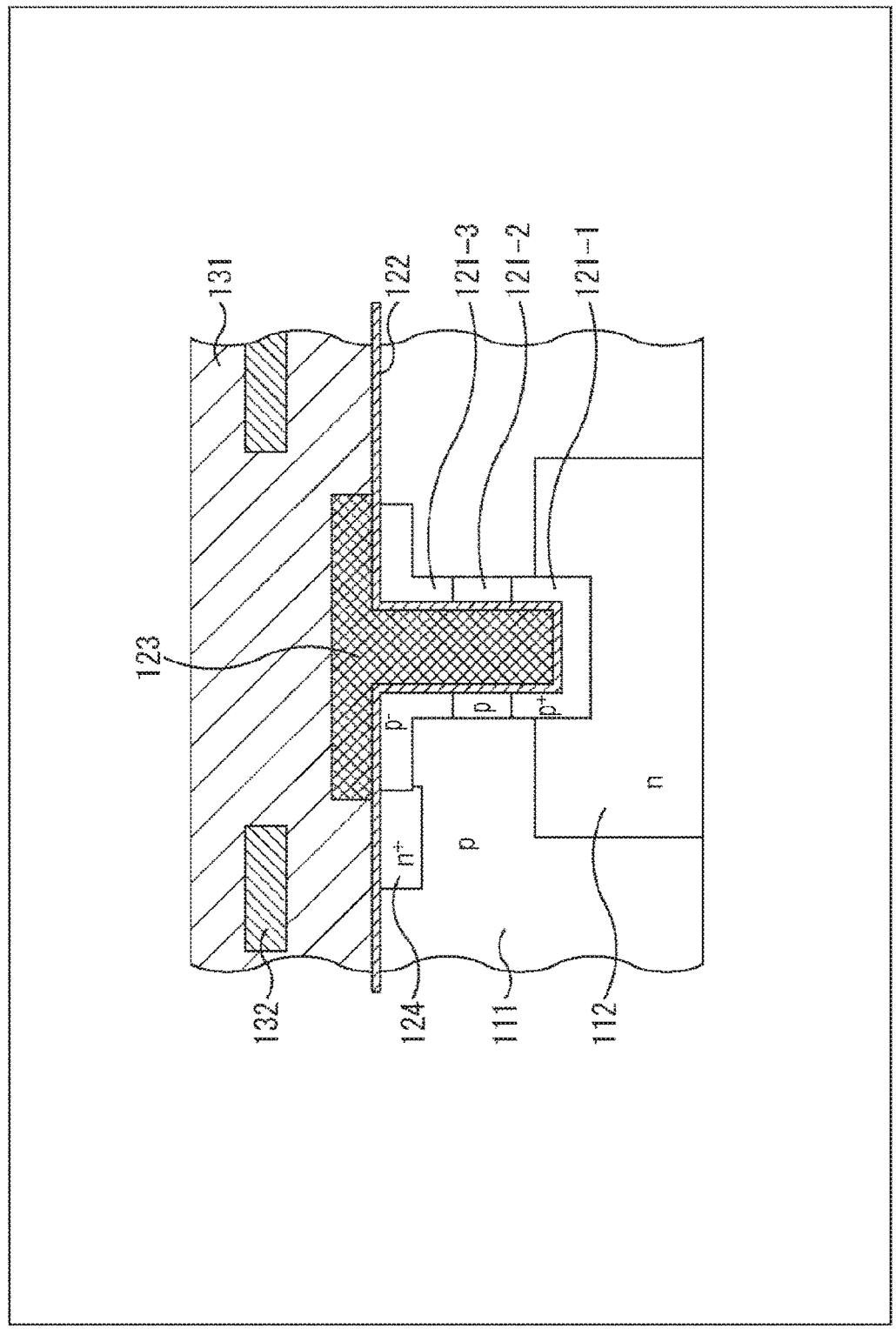
FIG. 8 is a cross-sectional view of an example structure of part of a vertical transistor.

In the example shown in FIG. 8, the concentration of the impurities implanted into the charge transfer channel 121 becomes lower in a stepwise manner in the direction toward the charge transfer destination (the floating diffusion layer 124). That is, the impurity concentration is expressed as: a charge transfer channel 121-1 (p+) >a charge transfer channel 121-2 (p)>a charge transfer channel 121-3 (p−).

With this, the potential of the charge transfer channel 121 can be made to become deeper in the direction toward the floating diffusion layer 124, as in the example shown in FIG. 3. Thus, the electric charge transfer from the photoelectric conversion unit 112 to the floating diffusion layer 124 can be facilitated.

It should be noted that the concentration of the impurities implanted into the charge transfer channel 121 may become gradually lower in the direction toward the charge transfer destination (the floating diffusion layer 124).

Also, in a case where the charge transfer channel is of the second conductivity type (n-type, for example), the impurity concentration may be controlled in a manner similar to the above. For example, the concentration of the impurities implanted into the charge transfer channel 171 of the second conductivity type (n-type, for example) may become higher in the direction toward the charge transfer destination (the floating diffusion layer 124). In that case, the concentration of the impurities may be made to become higher in a stepwise fashion in the direction toward the charge transfer destination (the floating diffusion layer 124), or become gradually higher in the direction toward the charge transfer destination (the floating diffusion layer 124).

Potential Gradient in a Rotational Direction

In an image sensor including pixels each having the above described structure, a potential gradient may be formed in a rotational direction along the gate electrode in the charge transfer channel.

Figure 9:
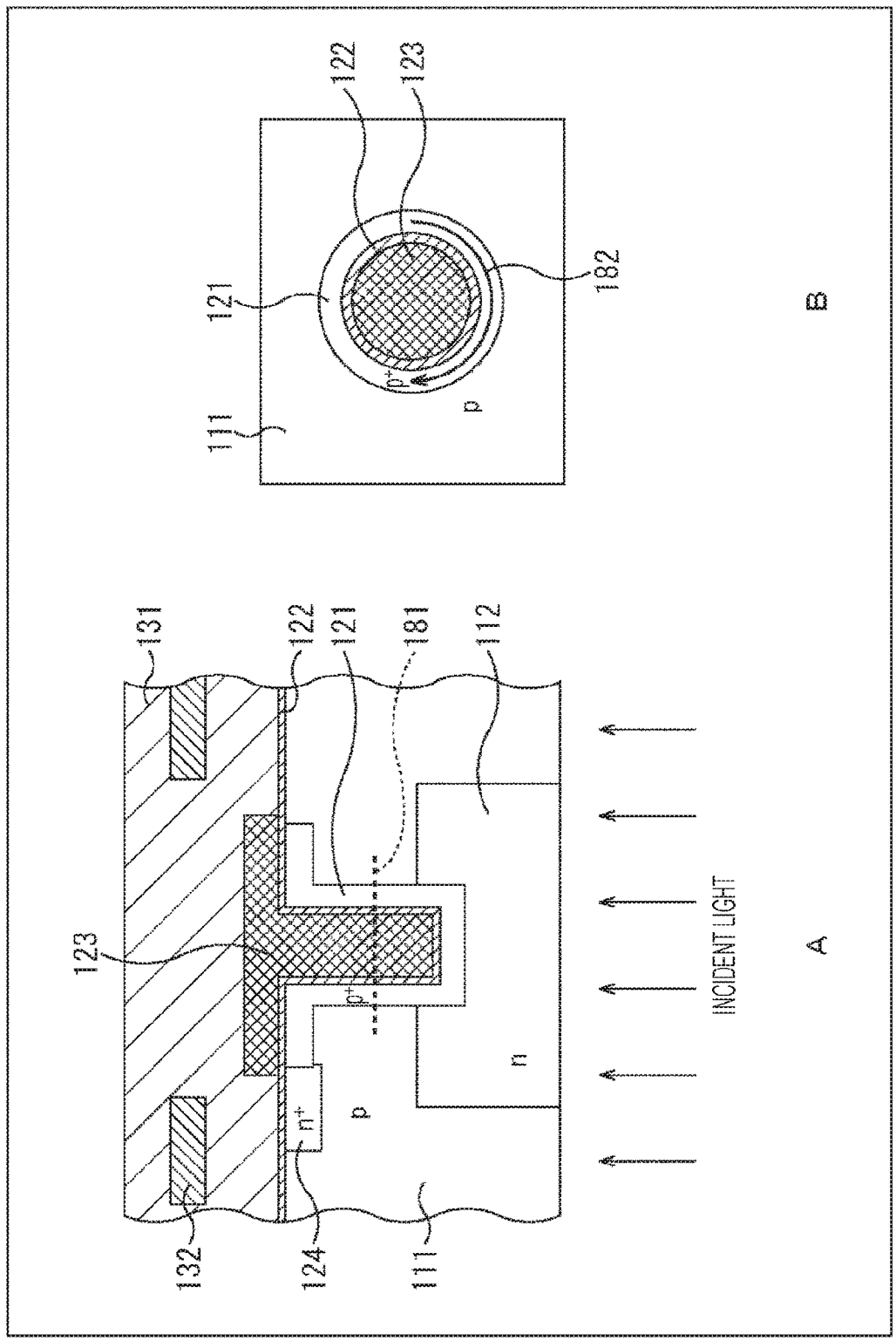
FIG. 9 shows cross-sectional views of an example structure of part of a vertical transistor.

For example, B of FIG. 9 is a cross-sectional view of the gate portion of the transfer transistor 120, taken in a horizontal direction indicated by a dotted line 181 shown in A of FIG. 9. An arrow 182 shown in B of FIG. 9 indicates a direction of rotation along and around the gate electrode 123 in the charge transfer channel 121 of the gate portion.

Figure 10:
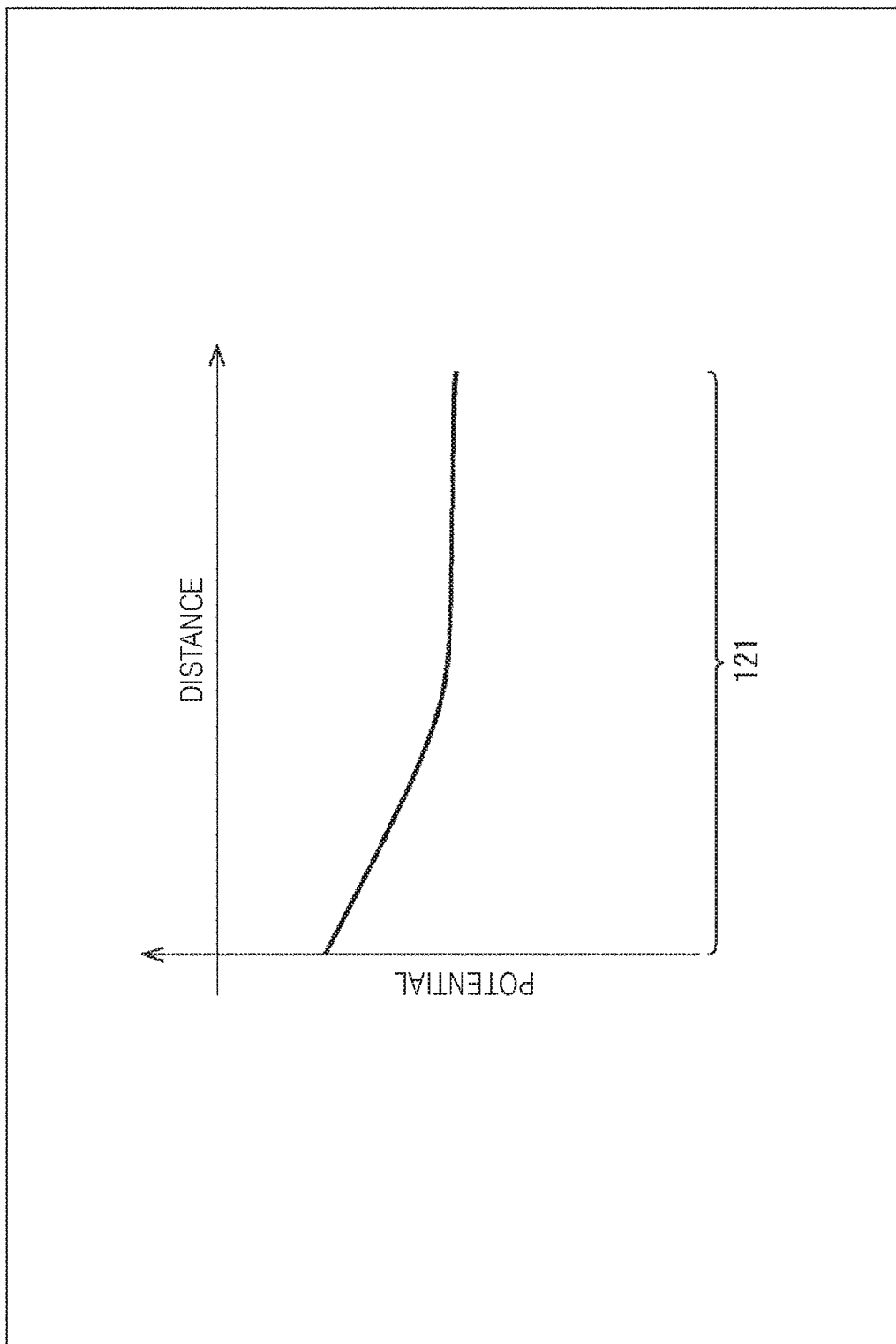
FIG. 10 is a graph for explaining a potential gradient.

FIG. 10 shows an example of the distribution of the potential in the direction indicated by the arrow 182. In the graph shown in FIG. 10, the abscissa axis indicates each position of the arrow 182, and the ordinate axis indicates the depth of the potential. As shown in the graph in FIG. 10, the potential of the charge transfer channel 121 varies along the arrow 182. That is, the potential of the charge transfer channel 121 has a gradient in the direction of the arrow 182 at least at part of the portion extending in the direction of the arrow 182.

As a potential gradient is formed in a rotational direction in the charge transfer channel 121 as described above, electric charge concentrates at the low-potential portion of the charge transfer channel 121, and is transferred from the photoelectric conversion unit 112 to the floating diffusion layer 124. Thus, electric charge can be transferred more easily from the photoelectric conversion unit 112 to the floating diffusion layer 124.

Gate Insulating Film Thickness Control

Next, a specific example of formation of the above described potential gradient in the charge transfer direction is described. The thickness of the gate insulating film may be made to vary in a rotational direction along the gate electrode. That is, the thickness of the gate insulating film 122 may be made to vary (or be biased) in the rotational direction indicated by the above mentioned arrow 182. For example, at part of the portion extending in the rotational direction indicated by the above mentioned arrow 182, the thickness of the gate insulating film 122 may be made to differ from that at the other portions (greater or smaller than the thickness at the other portions).

Figure 11:
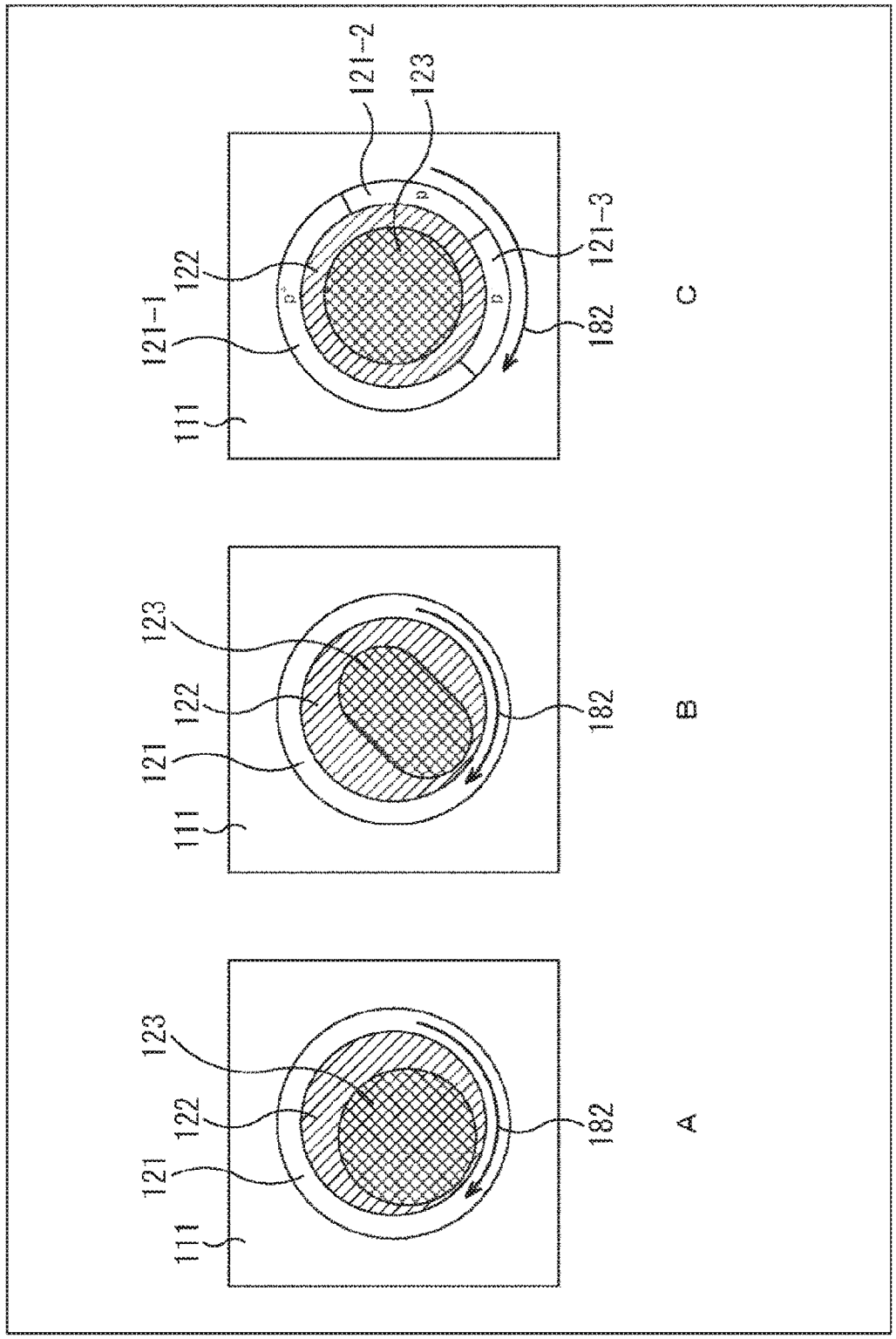
FIG. 11 shows cross-sectional views of example structures of part of vertical transistors.

For example, as shown in A of FIG. 11, the position of the center of the gate electrode 123 may be displaced from the position of the center of the gate insulating film 122 so that the thickness of the gate insulating film 122 is biased in the rotational direction indicated by the arrow 182.

Alternatively, as shown in B of FIG. 11, for example, the cross-sectional shape of the gate electrode 123 may be made to differ from the cross-sectional shape of the gate insulating film 122 so that the thickness of the gate insulating film 122 is biased in the rotational direction indicated by the arrow 182.

It should be noted that the variation (bias) of the thickness in the rotational direction may be either gradual variation or stepwise variation.

Charge Transfer Channel Impurity Concentration Control

Also, the charge transfer channel of the transfer transistor may be formed so that the impurity concentration varies in a rotational direction along the gate electrode in the charge transfer channel. For example, as shown in C of FIG. 11, the concentration of the impurities implanted into the charge transfer channel 121 may be made to vary in a rotational direction (the arrow 182) along the gate electrode.

In the example shown in C of FIG. 11, the concentration of the impurities implanted into the charge transfer channel 121 becomes lower in a stepwise manner in the direction toward the charge transfer destination (the floating diffusion layer 124). That is, the impurity concentration is expressed as: the charge transfer channel 121-1 (p+)>the charge transfer channel 121-2 (p)>the charge transfer channel 121-3 (p−).

With the above structure, electric charge concentrates at the low-potential portion of the charge transfer channel 121, and is transferred from the photoelectric conversion unit 112 to the floating diffusion layer 124. Thus, electric charge can be transferred more easily from the photoelectric conversion unit 112 to the floating diffusion layer 124.

It should be noted that the concentration of the impurities implanted into the charge transfer channel 121 may become gradually lower along the arrow 182.

In addition, in a case where the charge transfer channel is of the second conductivity type (n-type, for example), the thickness and the impurity concentration of the gate insulating film 122 may also be made to vary in a rotational direction along the gate electrode. That is, the charge transfer channel 171 may be provided, instead of the charge transfer channel 121, as in the examples shown in FIGS. 6 and 7. In that case, the thickness and the impurity concentration of the gate insulating film 122 may also be made to vary in a rotational direction along the gate electrode, as described above.

With the above structure, electric charge concentrates at the low-potential portion of the charge transfer channel 121, and is transferred from the photoelectric conversion unit 112 to the floating diffusion layer 124, as in the case with the charge transfer channel 121. Thus, electric charge can be transferred more easily from the photoelectric conversion unit 112 to the floating diffusion layer 124.

2. Second Embodiment

Manufacturing Apparatus

Next, the manufacturing of the above described image sensor 100 is described.

Figure 12:
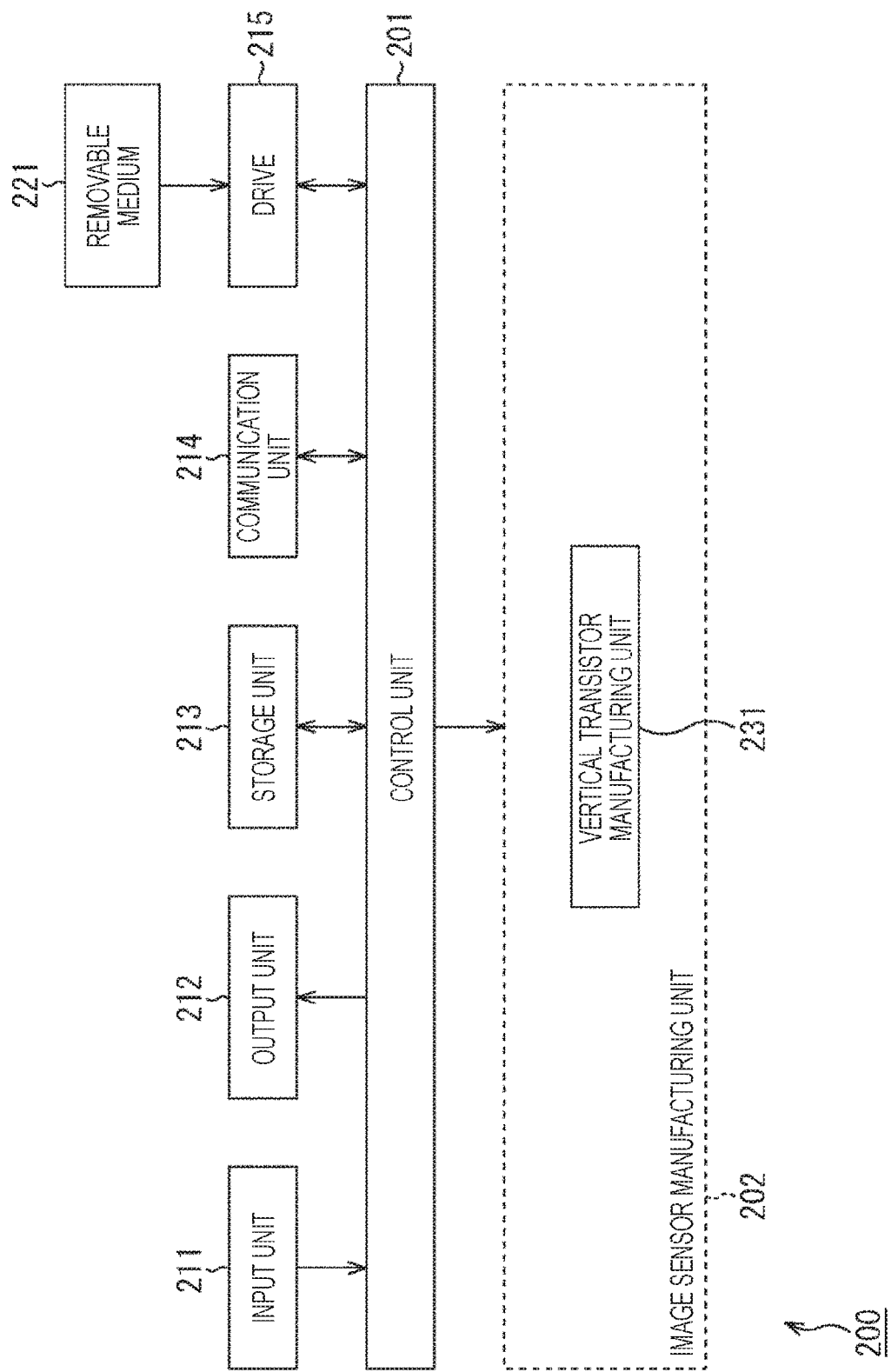
FIG. 12 is a block diagram showing a typical example configuration of a manufacturing apparatus.

FIG. 12 is a block diagram showing a typical example configuration of a manufacturing apparatus (a manufacturing apparatus as an embodiment of a manufacturing apparatus to which the present technology is applied) that manufactures the image sensor 100 as an embodiment of an imaging element to which the present technology is applied. The manufacturing apparatus 200 shown in FIG. 12 includes a control unit 201 and an image sensor manufacturing unit 202.

The control unit 201 includes a central processing unit (CPU), a read only memory (ROM), and a random access memory (RAM), for example. The control unit 201 controls the respective components of the image sensor manufacturing unit 202, and performs control processes related to the manufacturing of the image sensor 100. For example, the CPU of the control unit 201 performs various kinds of processes in accordance with a program stored in the ROM. The CPU also performs various kinds of processes in accordance with a program loaded from a storage unit 213 into the RAM. Data and the like necessary for the CPU to perform various kinds of processes are also stored in the RAM, as appropriate.

Under the control of the control unit 201, the image sensor manufacturing unit 202 performs processes related to the manufacturing of the image sensor 100. That is, in practice, the image sensor manufacturing unit 202 performs processes related to all the procedures for manufacturing the image sensor 100. For example, the image sensor manufacturing unit 202 forms the respective components of the semiconductor substrate layer 110 and the interconnect layer 130, and forms the components (such as those from the insulating film 141 to the on-chip lenses 152) on the back surface side of the semiconductor substrate layer 110. In the description below, however, only the portions related to the manufacturing of the gate portion of the transfer transistor 120 will be described, for ease of explanation.

The image sensor manufacturing unit 202 includes a vertical transistor manufacturing unit 231, for example. The vertical transistor manufacturing unit 231 performs processes related to the manufacturing of the transfer transistor 120, which is a vertical transistor.

The manufacturing apparatus 200 also includes an input unit 211, an output unit 212, the storage unit 213, a communication unit 214, and a drive 215.

The input unit 211 is formed with a keyboard, a mouse, a touch panel, and an external input terminal or the like. The input unit 211 receives a user instruction or an input of information from the outside, and supplies the user instruction or the information to the control unit 201. The output unit 212 is formed with a display such as a cathode ray tube (CRT) display or a liquid crystal display (LCD), a speaker, and an external output terminal or the like. The output unit 212 receives various kinds of information supplied from the control unit 201, and outputs the information as an image, a sound, an analog signal, or digital data.

The storage unit 213 includes an appropriate storage medium, such as a flash memory, a solid-state drive (SSD), or a hard disk. The storage unit 213 stores information supplied from the control unit 201, or reads and supplies stored information in accordance with a request from the control unit 201.

The communication unit 214 is formed with an interface, a modem, or the like for a wired local area network (LAN) or a wireless LAN, for example. The communication unit 214 performs a communication process with an external device via a network including the Internet. For example, the communication unit 214 transmits information supplied from the control unit 201 to a communication partner, or supplies information received from a communication partner to the control unit 201.

The drive 215 is connected to the control unit 201 as necessary. A removable medium 221 such as a magnetic disk, an optical disk, a magnetooptical disk, or a semiconductor memory is mounted on the drive 215 as appropriate. A computer program read from the removable medium 221 via the drive 215 is then installed into the storage unit 213 as necessary.

Vertical Transistor Manufacturing Unit

Figure 13:
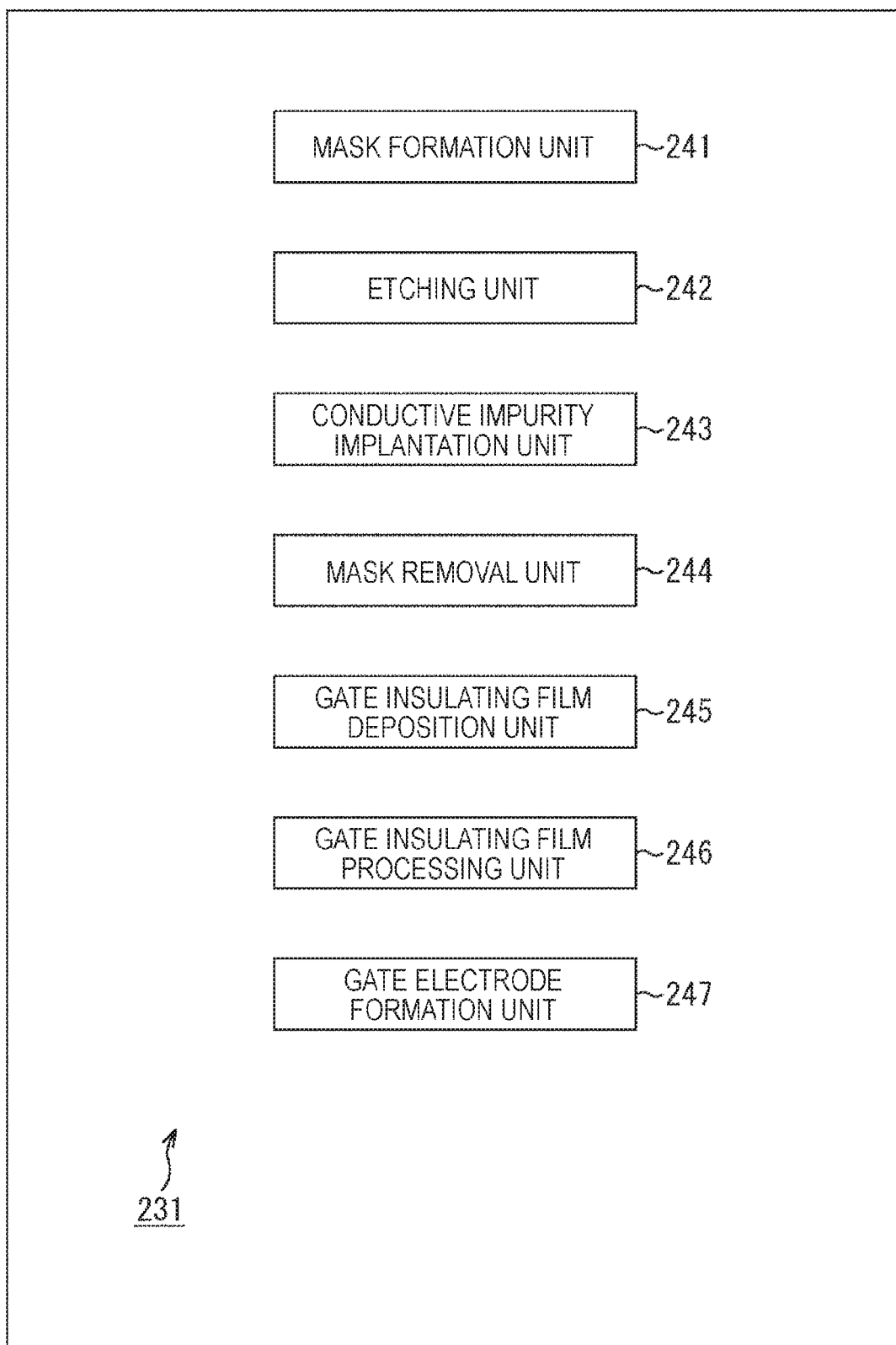
FIG. 13 is a block diagram showing a typical example configuration of a vertical transistor manufacturing unit.

Next, an example configuration of the vertical transistor manufacturing unit 231 is described. FIG. 13 is a block diagram showing an example configuration of the principal processing unit that performs processing related to the manufacturing of the gate portion of the transfer transistor 120 in the vertical transistor manufacturing unit 231.

As shown in FIG. 13, the vertical transistor manufacturing unit 231 includes a mask formation unit 241, an etching unit 242, a conductive impurity implantation unit 243, a mask removal unit 244, a gate insulating film deposition unit 245, a gate insulating film processing unit 246, and a gate electrode formation unit 247.

The mask formation unit 241 performs processing related to mask formation. The etching unit 242 performs processing related to etching of the semiconductor substrate 111 and the like. The conductive impurity implantation unit 243 performs processing related to implantation of conductive impurities. The mask removal unit 244 performs processing related to mask removal. The gate insulating film deposition unit 245 performs processing related to formation of the gate insulating film 122. The gate insulating film processing unit 246 performs processing related to processing of the gate insulating film 122. The gate electrode formation unit 247 performs processing related to formation of the gate electrode.

Having such a configuration, the vertical transistor manufacturing unit 231 can manufacture the gate portion of each of the examples described above with reference to FIGS. 4 through 7, for example. That is, the image sensor manufacturing unit 202 can manufacture the image sensor 100 including the transfer transistor 120 of each of the examples described above with reference to FIGS. 4 through 7.

Flow in a Vertical Transistor Gate Portion Manufacturing Process

Figure 14:
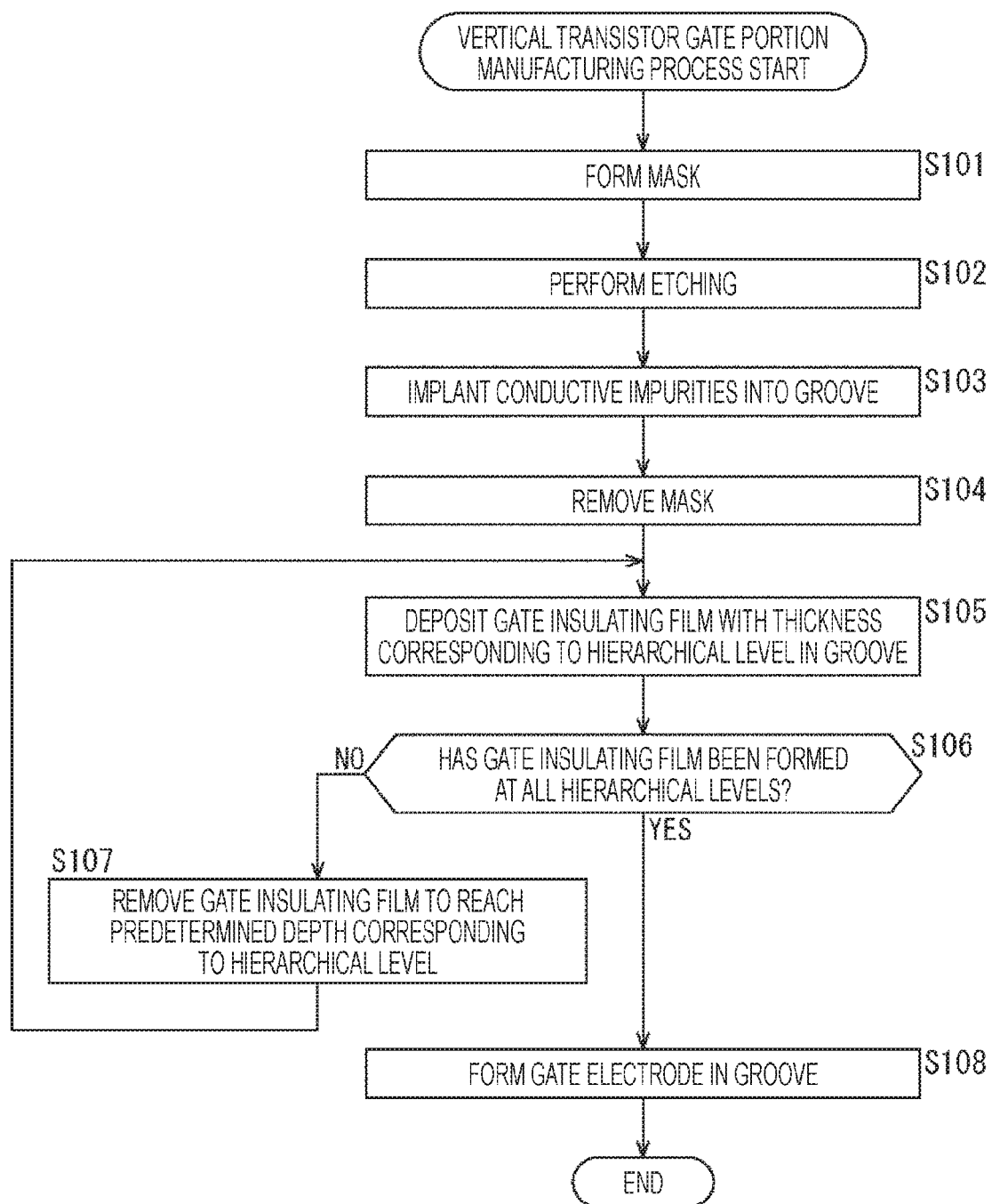
FIG. 14 is a flowchart for explaining an example flow in a vertical transistor gate portion manufacturing process.

Referring now to the flowchart in FIG. 14, an example flow in a vertical transistor gate portion manufacturing process to be performed by the vertical transistor manufacturing unit 231 of the example shown in FIG. 13 is described.

When the vertical transistor gate portion manufacturing process is started, the mask formation unit 241 in step S101 forms a mask for forming a groove at the position where the gate portion of the transfer transistor 120 is to be formed (on the front surface side of the photoelectric conversion unit 112, for example), from the front surface side of the semiconductor substrate 111.

In step S102, the etching unit 242 forms the groove by etching the semiconductor substrate 111 in accordance with the mask formed in step S101.

In step S103, the conductive impurity implantation unit 243 implants conductive impurities into the groove formed in step S102 in the semiconductor substrate 111.

In step S104, the mask removal unit 244 removes the mask formed in step S101.

The gate insulating film deposition unit 245 and the gate insulating film processing unit 246 hierarchize the groove formed in step S102, and perform processing at the respective hierarchical levels in the direction from the deepest hierarchical level toward the shallowest hierarchical level.

That is, in step S105, the gate insulating film deposition unit 245 deposits the gate insulating film 122 at the current hierarchical level in the groove formed in step S102 (or in the range of the depth of the current hierarchical level in the groove), the thickness of the gate insulating film 122 corresponding to the current hierarchical level. For example, in first-time processing, the gate insulating film deposition unit 245 deposits the gate insulating film 122 at the deepest hierarchical level (or in the range from the bottom of the groove to a predetermined depth) so that the gate insulating film 122 has a predetermined thickness corresponding to the hierarchical level. In addition, in second-time processing, the gate insulating film deposition unit 245 deposits the gate insulating film 122 at the next hierarchical level (or in the next depth range).

In step S106, the gate insulating film deposition unit 245 determines whether the gate insulating film 122 has been formed at all the hierarchical levels. In a case where the gate insulating film deposition unit 245 determines that there is a hierarchical level at which the gate insulating film 122 has not been formed yet, the process moves on to step S107.

In step S107, the gate insulating film processing unit 246 removes the gate insulating film 122 deposited in step S106 until reaching a predetermined depth corresponding to the current hierarchical level. That is, in step S106, the gate insulating film processing unit 246 removes the gate insulating film 122 deposited on the shallower portion than the lower limit depth (the shallowest portion) of the current hierarchical level in the groove. With this, the deposition of the gate insulating film 122 from the deepest portion (the bottom) to the shallowest portion of the current hierarchical level in the groove is completed.

When the process in step S107 is completed, the process returns to step S105. That is, the respective processes in steps S105 through S107 are repeatedly carried out for the respective hierarchical levels. In a case where it is determined in step S106 that the processing has been performed at all the hierarchical levels, and the gate insulating film 122 has been formed at all the hierarchical levels, the process moves on to step S108.

In this manner, the gate insulating film 122 is formed so that the thickness thereof varies in the depth direction of the groove or varies in a stepwise fashion in the charge transfer direction, as in the examples shown in FIGS. 5 and 7.

In step S108, the gate electrode formation unit 247 forms the gate electrode 123 in the groove of the gate insulating film 122 formed in the above manner.

When the process in step S108 is completed, the vertical transistor gate portion manufacturing process comes to an end.

By performing the above process, the vertical transistor manufacturing unit 231 can manufacture the gate portion of the transfer transistor 120 as in the examples described above with reference to FIGS. 5 and 7, for example. That is, the image sensor manufacturing unit 202 can manufacture the image sensor 100 including the transfer transistor 120 as in the examples described above with reference to FIGS. 5 and 7.

Flow in a Vertical Transistor Gate Portion Manufacturing Process

Figure 15:
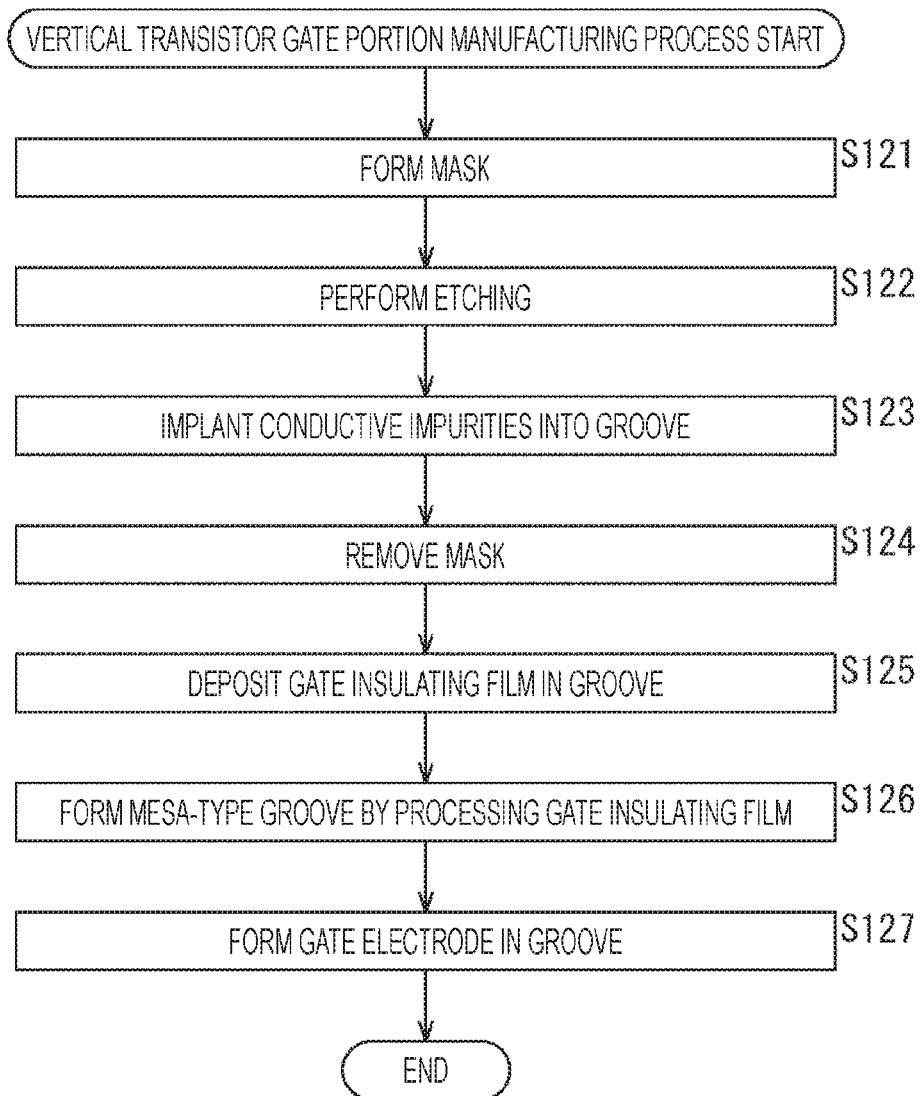
FIG. 15 is a flowchart for explaining an example flow in a vertical transistor gate portion manufacturing process.

Referring now to the flowchart in FIG. 15, another example flow in a vertical transistor gate portion manufacturing process to be performed by the vertical transistor manufacturing unit 231 of the example shown in FIG. 13 is described.

In this case, when the vertical transistor gate portion manufacturing process is started, the mask formation unit 241 in step S121 forms a mask, as in in the case shown in FIG. 14.

In step S122, the etching unit 242 forms a groove by etching the semiconductor substrate 111, as in the case shown in FIG. 14.

In step S123, the conductive impurity implantation unit 243 implants conductive impurities into the groove, as in the case shown in FIG. 14.

In step S124, the mask removal unit 244 removes the mask, as in the case shown in FIG. 14.

In step S125, the gate insulating film deposition unit 245 deposits the gate insulating film 122 with a predetermined thickness in the groove formed in step S122. The gate insulating film 122 may be deposited so as to fill the groove.

In step S126, the gate insulating film processing unit 246 processes the gate insulating film 122 deposited in step S125, to form a mesa-type groove.

In step S127, the gate electrode formation unit 247 forms the gate electrode 123 in the mesa-type groove of the gate insulating film 122 formed in the above manner.

When the process in step S127 is completed, the vertical transistor gate portion manufacturing process comes to an end.

By performing the above process, the vertical transistor manufacturing unit 231 can manufacture the gate portion of the transfer transistor 120 in which the thickness of the gate insulating film 122 gradually varies in the charge transfer direction, as in the examples described above with reference to FIGS. 4 and 6, for example. That is, the image sensor manufacturing unit 202 can manufacture the image sensor 100 including the transfer transistor 120 as in the examples described above with reference to FIGS. 4 and 6.

Vertical Transistor Manufacturing Unit

Figure 16:
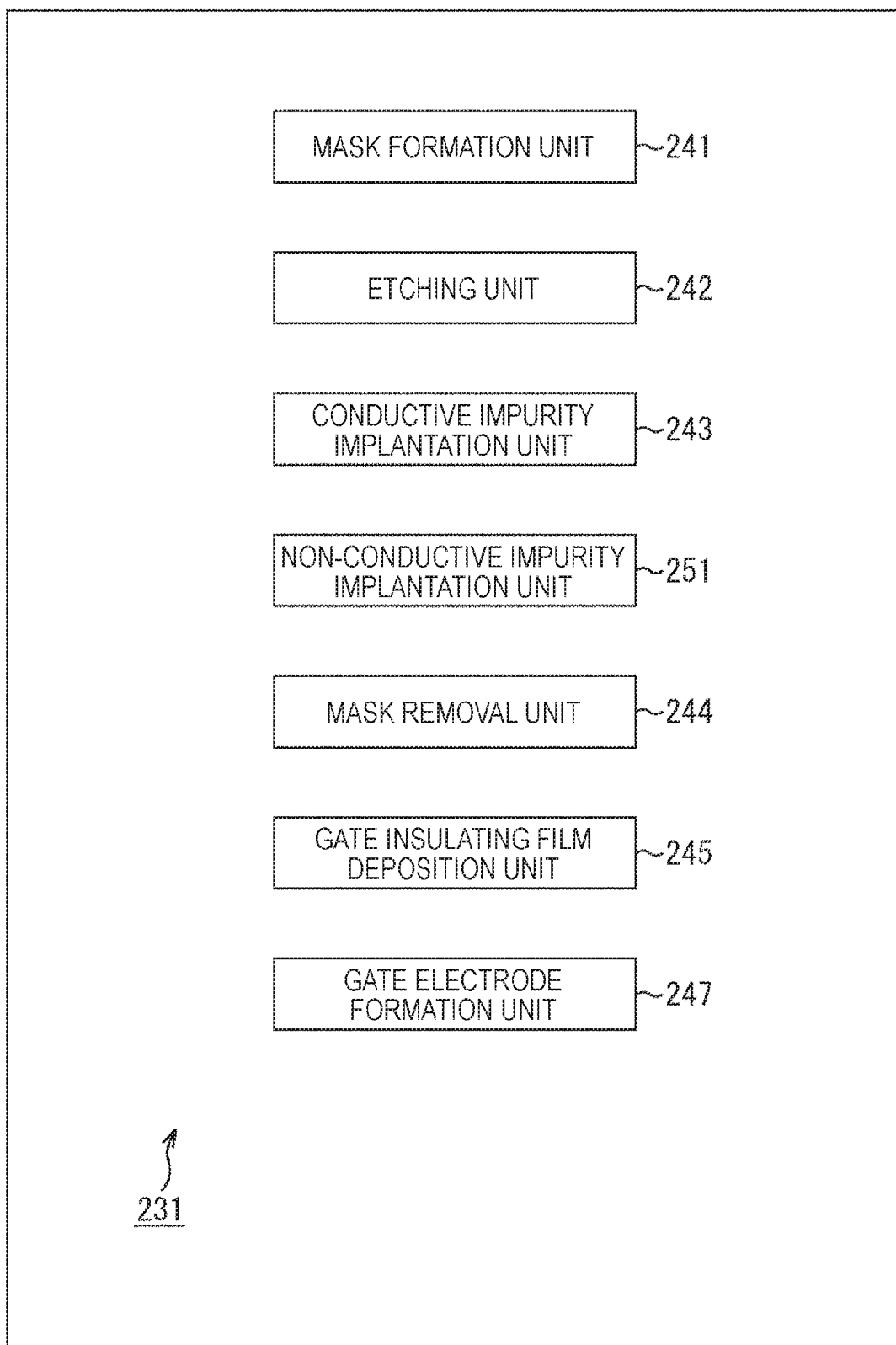
FIG. 16 is a block diagram showing a typical example configuration of a vertical transistor manufacturing unit.

FIG. 16 is a block diagram showing another example configuration of the principal processing unit that performs processing related to the manufacturing of the gate portion of the transfer transistor 120 in the vertical transistor manufacturing unit 231.

As shown in FIG. 16, the vertical transistor manufacturing unit 231 in this case includes a mask formation unit 241, an etching unit 242, a conductive impurity implantation unit 243, a non-conductive impurity implantation unit 251, a mask removal unit 244, a gate insulating film deposition unit 245, and a gate electrode formation unit 247.

The non-conductive impurity implantation unit 251 performs processing related to implantation of non-conductive impurities. As non-conductive impurities are implanted into the groove, thickness control can be performed on the oxide film formed through enhanced oxidation (the oxide film is the gate insulating film 122). That is, the non-conductive impurity implantation unit 251 can control the thickness of the gate insulating film 122 by controlling the amount (or the concentration) of the non-conductive impurities to be implanted into the groove. In other words, by controlling the amount (the concentration) of the non-conductive impurities to be implanted in accordance with the depth direction of the groove, the non-conductive impurity implantation unit 251 can control the thickness of the gate insulating film 122 (or the depth of the potential of the charge transfer channel) in the depth direction of the groove (or in the charge transfer direction).

As described above, having such a configuration, the vertical transistor manufacturing unit 231 can manufacture the gate portion of each of the examples described above with reference to FIGS. 4 through 7, for example. That is, the image sensor manufacturing unit 202 can manufacture the image sensor 100 including the transfer transistor 120 of each of the examples described above with reference to FIGS. 4 through 7.

Flow in a Vertical Transistor Gate Portion Manufacturing Process

Figure 17:
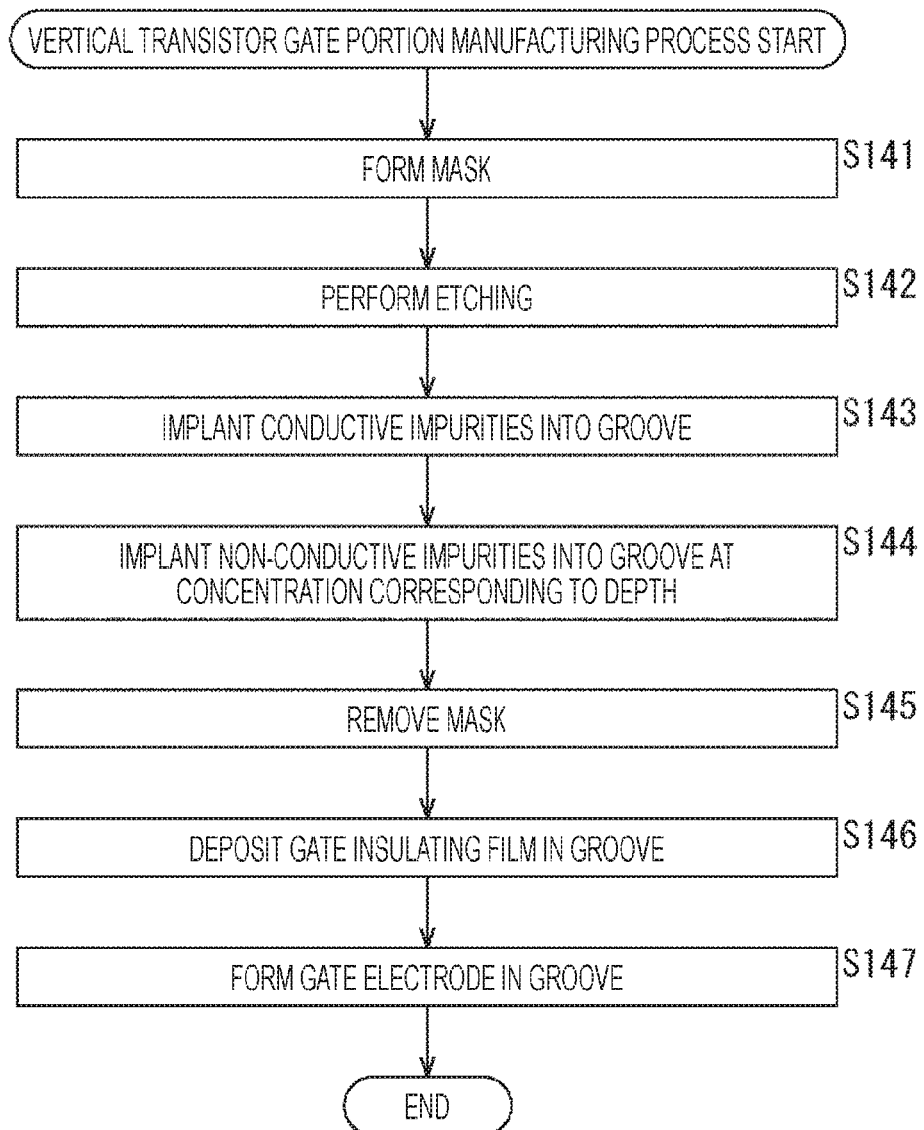
FIG. 17 is a flowchart for explaining an example flow in a vertical transistor gate portion manufacturing process.

Referring now to the flowchart in FIG. 17, another example flow in a vertical transistor gate portion manufacturing process to be performed by the vertical transistor manufacturing unit 231 of the example shown in FIG. 16 is described.

In this case, when the vertical transistor gate portion manufacturing process is started, the components from the mask formation unit 241 to the conductive impurity implantation unit 243 perform the respective processes in steps S141 through S143 in a manner similar to the respective processes in steps S101 through S103 in FIG. 14.

In step S144, the non-conductive impurity implantation unit 251 implants non-conductive impurities into the bottom surface and the side surfaces of the groove formed in step S142, at concentrations corresponding to the depths.

In step S145, the mask removal unit 244 removes the mask, as in the case shown in FIG. 14.

In step S146, the gate insulating film deposition unit 245 deposits the gate insulating film 122 with a predetermined thickness in the groove formed in step S142. As a result of the process in step S144, the non-conductive impurities are implanted into the groove as appropriate. Thus, the gate insulating film 122 has a thickness corresponding to the concentration of the non-conductive impurities by virtue of enhanced oxidation. That is, the gate insulating film 122 has a thickness corresponding to the depth of the groove.

In step S147, the gate electrode formation unit 247 forms the gate electrode 123 in the groove of the gate insulating film 122 formed in the above manner.

When the process in step S147 is completed, the vertical transistor gate portion manufacturing process comes to an end.

By performing the above process, the vertical transistor manufacturing unit 231 can manufacture the gate portion of the transfer transistor 120 of each of the examples described above with reference to FIGS. 4 through 7, for example.

For example, in step S144, the non-conductive impurity implantation unit 251 implants the non-conductive impurities at a concentration that varies in a stepwise fashion in the depth direction of the groove, so that the thickness of the gate insulating film 122 formed through the process in step S146 varies in a stepwise fashion in the depth direction. Thus, the vertical transistor manufacturing unit 231 can manufacture the gate portion of the transfer transistor 120 of each of the examples described above with reference to FIGS. 5 and 7, for example.

Also, in step S144, for example, the non-conductive impurity implantation unit 251 implants the non-conductive impurities at a concentration that varies gradually in the depth direction of the groove, so that the thickness of the gate insulating film 122 formed through the process in step S146 varies gradually in the depth direction. Thus, the vertical transistor manufacturing unit 231 can manufacture the gate portion of the transfer transistor 120 of each of the examples described above with reference to FIGS. 4 and 6, for example.

That is, the image sensor manufacturing unit 202 can manufacture the image sensor 100 including the transfer transistor 120 as in the examples described above with reference to FIGS. 4 through 7.

Vertical Transistor Manufacturing Unit

Figure 18:
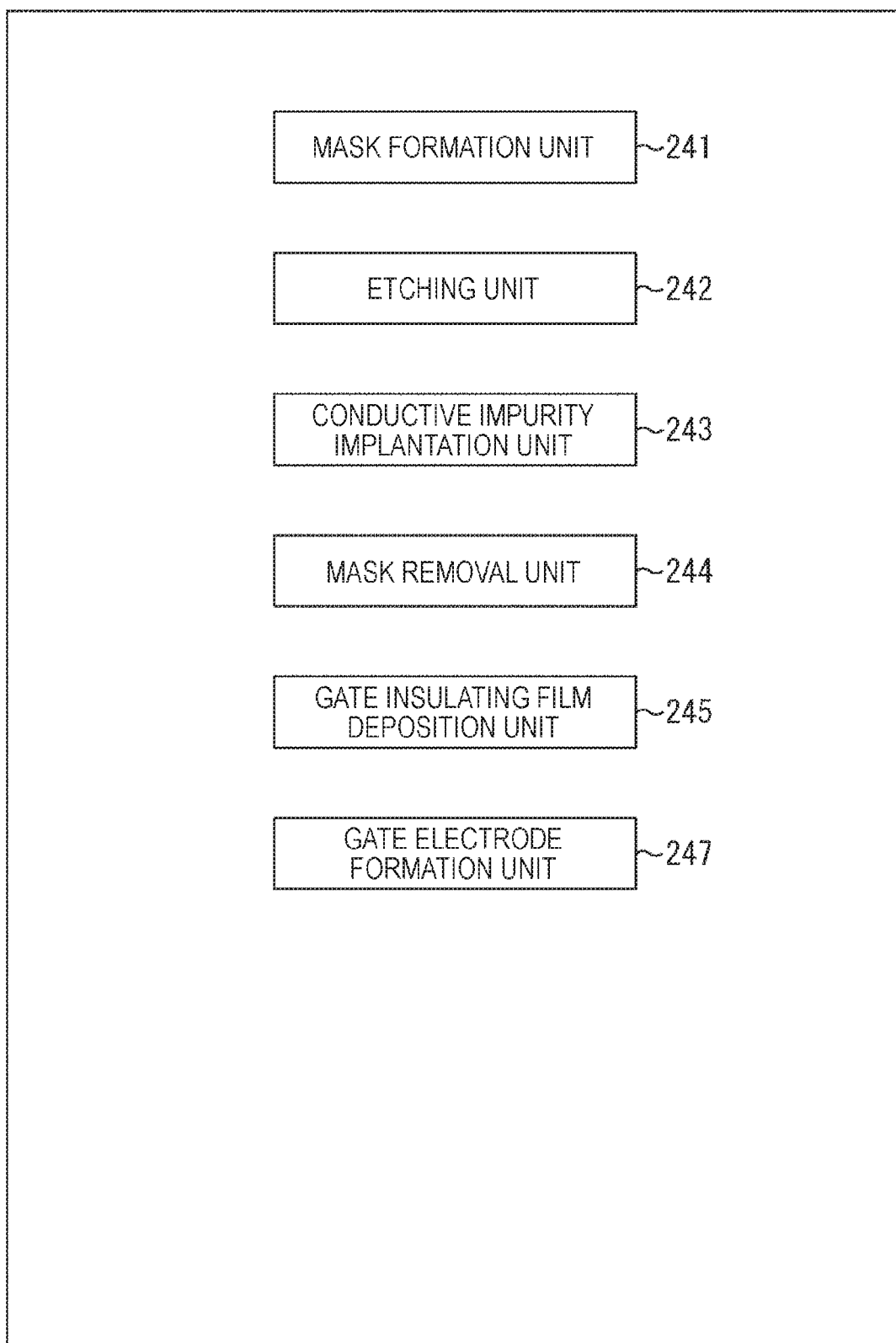
FIG. 18 is a block diagram showing a typical example configuration of a vertical transistor manufacturing unit.

FIG. 18 is a block diagram showing yet another example configuration of the principal processing unit that performs processing related to the manufacturing of the gate portion of the transfer transistor 120 in the vertical transistor manufacturing unit 231.

As shown in FIG. 18, the vertical transistor manufacturing unit 231 in this case includes a mask formation unit 241, an etching unit 242, a conductive impurity implantation unit 243, a mask removal unit 244, a gate insulating film deposition unit 245, and a gate electrode formation unit 247.

The conductive impurity implantation unit 243 implants conductive impurities at a concentration corresponding to the depth of the implantation position in the groove. By controlling the concentration of the conductive impurities in accordance with the depth at which the implantation is performed, the conductive impurity implantation unit 243 can control the depth of the potential of the charge transfer channel 121 in the depth direction of the groove (or in the charge transfer direction). That is, the conductive impurity implantation unit 243 can form a potential gradient in the charge transfer direction in the charge transfer channel 121.

As described above, having such a configuration, the vertical transistor manufacturing unit 231 can manufacture the gate portion in which the concentration of the conductive impurities implanted into the charge transfer channel 121 varies in the charge transfer direction, as in the example described above with reference to FIG. 8, for example. That is, the image sensor manufacturing unit 202 can manufacture the image sensor 100 including the transfer transistor 120 in which the concentration of the conductive impurities implanted into the charge transfer channel 121 varies in the charge transfer direction, as in the example described above with reference to FIG. 8, for example.

Flow in a Vertical Transistor Gate Portion Manufacturing Process

Figure 19:
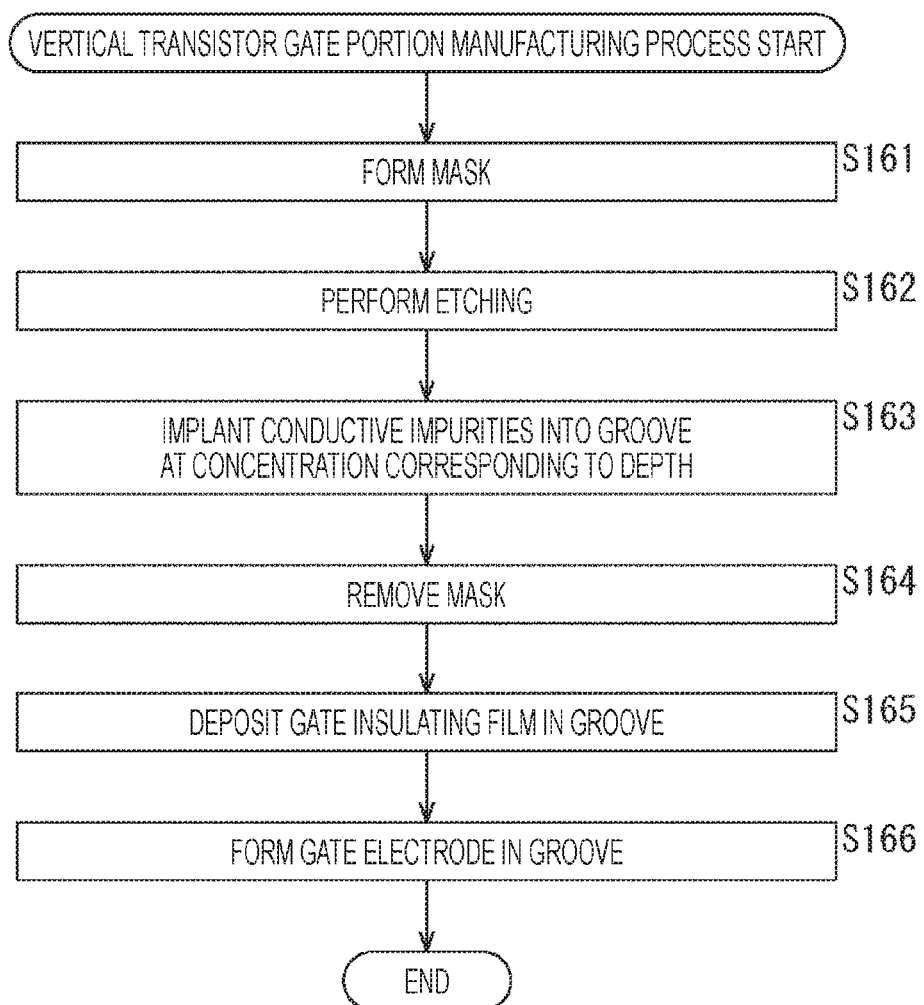
FIG. 19 is a flowchart for explaining an example flow in a vertical transistor gate portion manufacturing process.

Referring now to the flowchart in FIG. 19, another example flow in a vertical transistor gate portion manufacturing process to be performed by the vertical transistor manufacturing unit 231 of the example shown in FIG. 18 is described.

In this case, when the vertical transistor gate portion manufacturing process is started, the mask formation unit 241 and the etching unit 242 perform the respective processes in steps S161 and S162 in a manner similar to the respective processes in steps S101 and S102 in FIG. 14.

In step S163, the conductive impurity implantation unit 243 implants conductive impurities into the groove formed in step S162, at a concentration corresponding to the depth of the position at which the implantation is performed.

In step S164, the mask removal unit 244 removes the mask, as in the case shown in FIG. 14.

In step S165, the gate insulating film deposition unit 245 deposits the gate insulating film 122 with a predetermined thickness in the groove formed in step S162.

In step S166, the gate electrode formation unit 247 forms the gate electrode 123 in the groove of the gate insulating film 122 formed in the above manner.

When the process in step S166 is completed, the vertical transistor gate portion manufacturing process comes to an end.

By performing the process as described above, the vertical transistor manufacturing unit 231 can manufacture the gate portion of the transfer transistor 120 in which the concentration of the conductive impurities implanted into the charge transfer channel 121 varies in the charge transfer direction, as in the example described above with reference to FIG. 8, for example. That is, the image sensor manufacturing unit 202 can manufacture the image sensor 100 including the transfer transistor 120 in which the concentration of the conductive impurities implanted into the charge transfer channel 121 varies in the charge transfer direction, as in the example described above with reference to FIG. 8, for example.

Vertical Transistor Manufacturing Unit

The following is a description of an example configuration of the vertical transistor manufacturing unit 231 in a case where the charge transfer channel 121 has a potential gradient formed in a rotational direction along the gate electrode 123. In this case, the vertical transistor manufacturing unit 231 may have a configuration similar to the example described above with reference to FIG. 13, for example. That is, the vertical transistor manufacturing unit 231 may include components from the mask formation unit 241 to the gate electrode formation unit 247.

Flow in a Vertical Transistor Gate Portion Manufacturing Process

Figure 20:
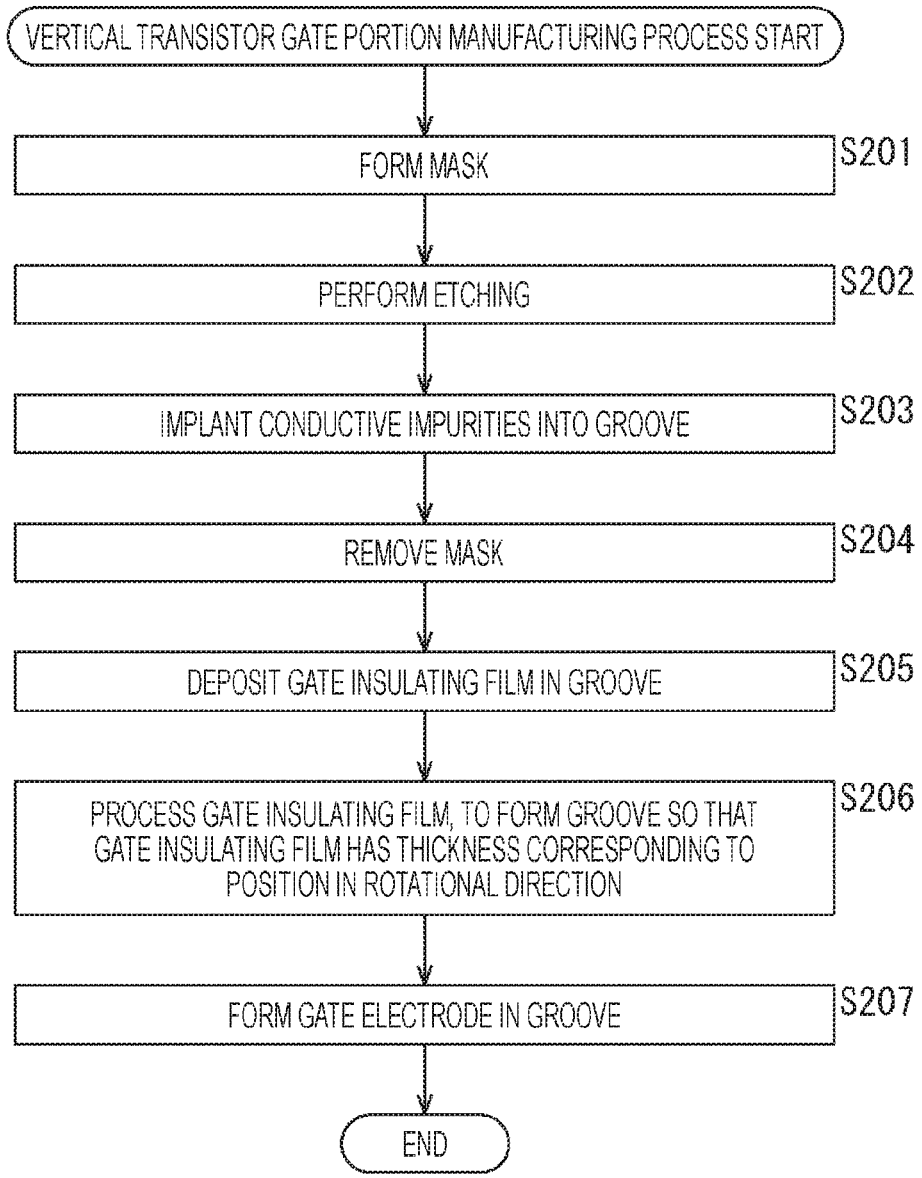
FIG. 20 is a flowchart for explaining an example flow in a vertical transistor gate portion manufacturing process.

Referring now to the flowchart in FIG. 20, an example flow in a vertical transistor gate portion manufacturing process to be performed by the vertical transistor manufacturing unit 231 in this case is described.

In this case, when the vertical transistor gate portion manufacturing process is started, the components from the mask formation unit 241 to the gate insulating film deposition unit 245 perform the respective processes in steps S201 through S205 in a manner similar to the respective processes in steps S121 through S125 in FIG. 15.

In step S206, the gate insulating film processing unit 246 processes the gate insulating film 122 deposited in step S205, to form a groove in the gate insulating film 122 so that the gate insulating film 122 has a thickness corresponding to the position in the rotational direction. For example, the gate insulating film processing unit 246 can vary the thickness of the gate insulating film 122 in accordance with the position in *he rotational direction by forming a groove in the gate insulating film 122 as in the examples shown in A of FIG. 11 and B of FIG. 11.

In step S207, the gate electrode formation unit 247 forms the gate electrode 123 in the groove of the gate insulating film 122 formed in step S206.

When the process in step S207 is completed, the vertical transistor gate portion manufacturing process comes to an end.

By performing the above process, the vertical transistor manufacturing unit 231 can manufacture the gate portion of the transfer transistor 120 in which the thickness of the gate insulating film 122 varies gradually or in a stepwise fashion in the rotational direction, as in the examples described above with reference to FIGS. 10 and 11, for example. That is, the image sensor manufacturing unit 202 can manufacture the image sensor 100 including the transfer transistor 120 as in the examples described above with reference to FIGS. 10 and 11.

Vertical Transistor Manufacturing Unit

The following is a description of another example configuration of the vertical transistor manufacturing unit 231 in a case where the charge transfer channel 121 has a potential gradient formed in a rotational direction along the gate electrode 123. In this case, the vertical transistor manufacturing unit 231 may have a configuration similar to the example described above with reference to FIG. 18, for example. That is, the vertical transistor manufacturing unit 231 may include components from the mask formation unit 241 to the gate insulating film deposition unit 245, and the gate electrode formation unit 247.

Flow in a Vertical Transistor Gate Portion Manufacturing Process

Figure 21:
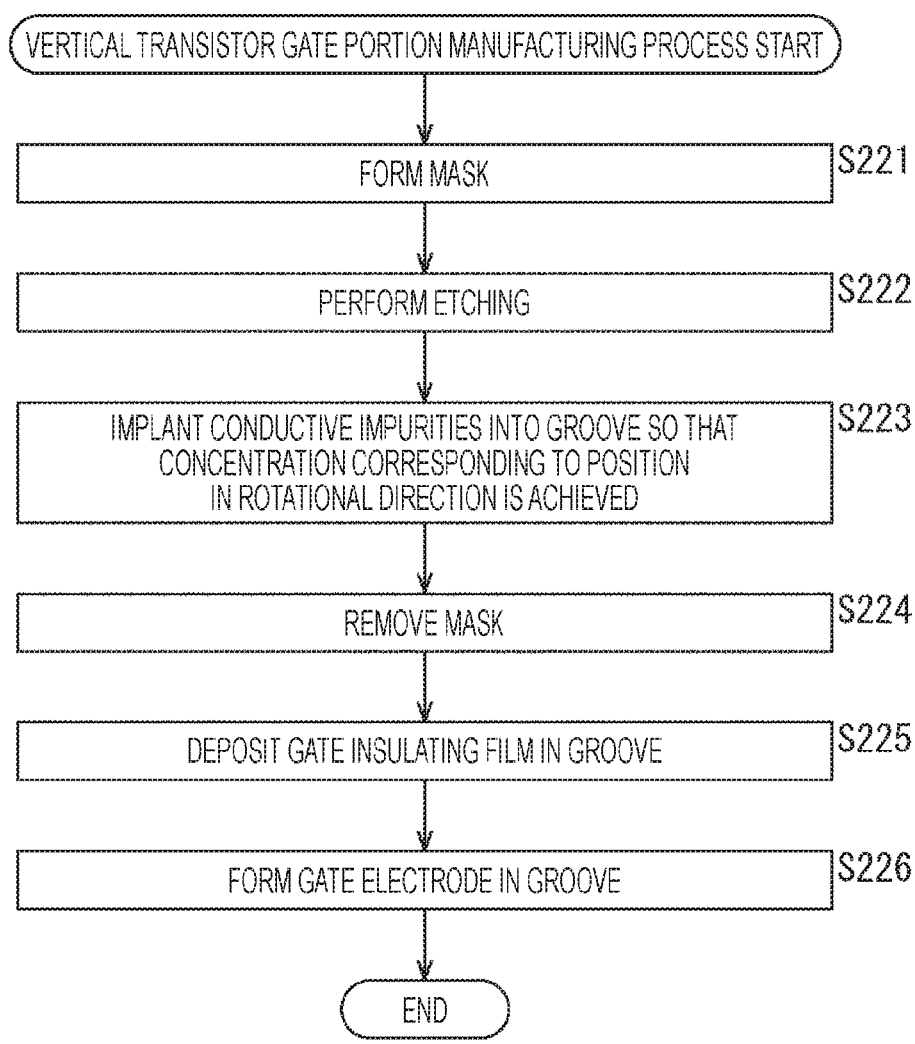
FIG. 21 is a flowchart for explaining an example flow in a vertical transistor gate portion manufacturing process.

Referring now to the flowchart in FIG. 21, an example flow in a vertical transistor gate portion manufacturing process to be performed by the vertical transistor manufacturing unit 231 in this case is described.

In this case, when the vertical transistor gate portion manufacturing process is started, the mask formation unit 241 and the etching unit 242 perform the respective processes in steps S221 and S222 in a manner similar to the respective processes in steps S161 and S162 in FIG. 19.

In step S223, the conductive impurity implantation unit 243 implants conductive impurities into the groove formed in step S222, at a concentration corresponding to the position in the rotational direction at which the implantation is performed.

The mask removal unit 244, the gate insulating film deposition unit 245, and the gate electrode formation unit 247 perform the respective processes in steps S224 through S226 in a manner similar to the respective processes in steps S164 through S166 in FIG. 19.

When the process in step S226 is completed, the vertical transistor gate portion manufacturing process comes to an end.

By performing the process as described above, the vertical transistor manufacturing unit 231 can manufacture the gate portion of the transfer transistor 120 in which the concentration of the conductive impurities implanted into the charge transfer channel 121 varies in a rotational direction, as in the example described above with reference to FIG. 10 and C of FIG. 11, for example. That is, the image sensor manufacturing unit 202 can manufacture the image sensor 100 including the transfer transistor 120 in which the concentration of the conductive impurities implanted into the charge transfer channel 121 varies in a rotational direction, as in the example described above with reference to FIG. 10 and C of FIG. 11, for example.

3. Third Embodiment

Imaging Device

The above described image sensor 100 (an imaging device) manufactured according to the present technology can be used in a device such as an imaging device, for example. That is, the present technology can be embodied not only as an imaging element but also as a device (such as an imaging device) using the imaging element.

Figure 22:
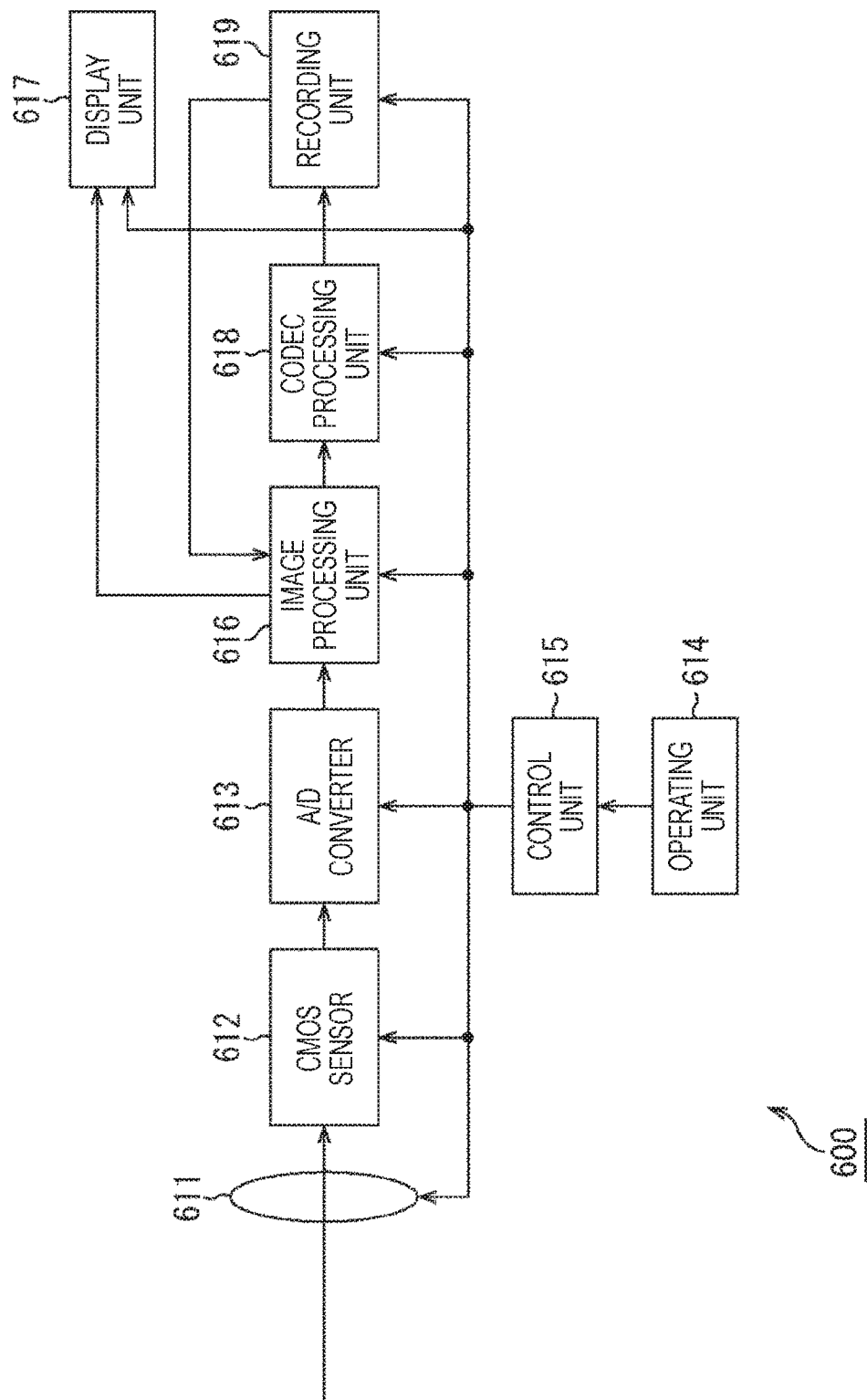
FIG. 22 is a block diagram showing a typical example configuration of an imaging device.

FIG. 22 is a block diagram showing a typical example configuration of an imaging device as an example of an electronic device to which the present technology is applied. The imaging device 600 shown in FIG. 22 is a device that images an object, and outputs an image of the object as an electric signal.

As shown in FIG. 22, the imaging device 600 includes an optical unit 611, a CMOS sensor 612, an A/D converter 613, an operating unit 614, a control unit 615, an image processing unit 616, a display unit 617, a codec processing unit 618, and a recording unit 619.

The optical unit 611 includes a lens that adjusts the focal point of the object and collects light from the focal position, a diaphragm that adjusts exposure, a shutter that controls timings for imaging, and the like. The optical unit 611 passes light (incident light) from the object on to the CMOS sensor 612.

The CMOS sensor 612 performs photoelectric conversion on the incident light, and supplies a signal (pixel signal) of each pixel to the A/D converter 613.

The A/D converter 613 converts the pixel signals supplied from the CMOS sensor 612 at a predetermined timing into digital data (image data), and sequentially supplies the digital data to the image processing unit 616 at a predetermined timing.

The operating unit 614 is formed with an appropriate input device such as a Jog Dial (trademark), keys, buttons, or a touch panel, receives an operation input from a user, for example, and supplies a signal corresponding to the operation input to the control unit 615.

In accordance with the signal corresponding to the user's operation input from the operating unit 614, the control unit 615 controls driving of the optical unit 611, the CMOS sensor 612, the A/D converter 613, the image processing unit 616, the display unit 617, the codec processing unit 618, and the recording unit 619, and causes the respective components to perform processing related to imaging.

The image processing unit 616 performs various kinds of image processing, such as color mixing correction, black level correction, white balance adjustment, demosaicing, matrix processing, gamma correction, and YC conversion, on the image data supplied from the A/D converter 613. The image processing unit 616 then supplies the display unit 617 and the codec processing unit 618 with the image data subjected to the image processing.

The display unit 617 is designed as a liquid crystal display, for example, and displays an image of the object in accordance with the image data supplied from the image processing unit 616.

The codec processing unit 618 performs a predetermined encoding process on the image data supplied from the image processing unit 616, and supplies the obtained encoded data to the recording unit 619.

The recording unit 619 records the encoded data supplied from the codec processing unit 618. The encoded data recorded in the recording unit 619 is read into the image processing unit 616 and is decoded as necessary. The image data obtained through the decoding process is then supplied to the display unit 617, and the corresponding image is displayed.

The above described present technology is applied to the CMOS sensor 612 of such an imaging device 600. That is, an image sensor 100 to which the present technology is applied is used as the CMOS sensor 612. Therefore, the CMOS sensor 612 includes a vertical transistor that has a potential with a gradient in at least part of the charge transfer channel that transfers electric charge of a photoelectric conversion unit. Accordingly, the CMOS sensor 612 can transfer electric charge more easily. Thus, the imaging device 600 can obtain an image with higher image quality by imaging an object (can reduce degradation of the quality of the obtained image).

It should be noted that an imaging device to which the present technology is applied does not necessarily have the above described configuration, and may have some other configuration. For example, the imaging device may not be a digital still camera or a video camera, but may be an information processing device having an imaging function, such as a portable telephone device, a smartphone, a tablet-type device, or a personal computer. Alternatively, the imaging device may be a camera module that is mounted on another information processing device and is used (or is mounted as a built-in device on another information processing device).

4. Example Applications

Software

The above described series of processes may be performed either by hardware or by software. In a case where the above described series of processes are to be performed by software, the program that forms the software is installed from a network or a recording medium.

This recording medium is formed with the removable medium 221 that is distributed to deliver the program to users separately from devices, and has the program recorded therein, as shown in FIG. 12, for example. This removable medium 221 includes a magnetic disk (including a flexible disk) and an optical disk (including a CD-ROM and a DVD). Further, a magnetooptical disk (including a Mini Disc (MD)), a semiconductor memory, and the like are included. In that case, the removable medium 221 is mounted on the drive 215, for example, so that this program stored in the removable medium 221 can be read and installed into the storage unit 213.

Alternatively, this program can be provided via a wired or wireless transmission medium such as a local area network, the Internet, or digital satellite broadcasting. In that case, the program may be received by the communication unit 214, and be installed into the storage unit 213, for example.

Also, this program may be installed beforehand into a storage unit, a ROM, or the like. For example, the program can be installed beforehand into the storage unit 213, the ROM in the control unit 201, or the like.

It should be noted that the program to be executed by a computer may be a program for performing processes in chronological order in accordance with the sequence described in the present specification, or may be a program for performing processes in parallel or performing a process when necessary, such as when there is a call.

Also, in the present specification, steps describing a program recorded on a recording medium include processes to be performed in parallel or independently of one another if not necessarily in chronological order, as well as processes to be performed in chronological order in accordance with the sequence described herein.

Also, the processes in the respective steps described above may be carried out in each of the above described devices or any appropriate device other than the above described devices. In that case, the device that is to carry out the processes should have the above described functions (functional blocks and the like) necessary for carrying out the processes. Also, the information necessary for carrying out the processes should be transmitted to the device as appropriate.

Other Aspects

It should be noted that, in the present specification, a system means an assembly of components (devices, modules (parts), and the like), and not all the components need to be provided in the same housing. In view of this, devices that are housed in different housings and are connected to one another via a network form a system, and one device having modules housed in one housing is also a system.

Furthermore, any configuration described above as one device (or processing unit) may be divided into two or more devices (or processing units). Conversely, any configuration described above as two or more devices (or processing units) may be combined into one device (or processing unit). Furthermore, it is of course possible to add components other than those described above to the configuration of any of the devices (or processing units). Furthermore, some components of a device (or processing unit) may be incorporated into the configuration of another device (or processing unit) as long as the configuration and the functions of the entire system remain substantially the same.

While preferred embodiments of the present disclosure have been described above with reference to the accompanying drawings, the technical scope of the present disclosure is not limited to those examples. It is apparent that those who have ordinary skills in the technical field of the present disclosure can make various changes or modifications within the scope of the technical spirit claimed herein, and it should be understood that those changes or modifications are within the technical scope of the present disclosure.

For example, the present technology can be embodied in a cloud computing configuration in which one function is shared among devices via a network, and processing is performed by the devices cooperating with one another.

Also, the respective steps described with reference to the above described flowcharts can be carried out by one device or can be shared among devices.

Further, in a case where more than one process is included in one step, the processes included in the step can be performed by one device or can be shared among devices.

The present technology is not limited to this, and can also be embodied as any configuration to be mounted on the above devices or devices in the systems, such as a processor serving as a system large scale integration (LSI) or the like, a module using processors or the like, a unit using modules or the like, and a set (or a configuration in a device) having other functions added to the unit.

It should be noted that the present technology may also be embodied in the configurations described below.

(1) An imaging element including
a vertical transistor that has a potential with a gradient in at least part of a charge transfer channel that transfers electric charge of a photoelectric conversion unit.

(2) The imaging element of (1), in which the potential has a gradient in a charge transfer direction in the charge transfer channel, the gradient becoming deeper in the direction toward the transfer destination of the electric charge.

(3) The imaging element of (2), in which
the charge transfer channel is a charge transfer channel of a first conductivity type that transfers the electric charge of the photoelectric conversion unit of a second conductivity type, the photoelectric conversion unit being formed in a semiconductor of the first conductivity type, and
a gate insulating film is formed between the charge transfer channel and a gate electrode, to have a thickness that becomes gradually smaller in the direction toward the transfer destination of the electric charge.

(4) The imaging element of (2), in which
the charge transfer channel is a charge transfer channel of a first conductivity type that transfers the electric charge of the photoelectric conversion unit of a second conductivity type, the photoelectric conversion unit being formed in a semiconductor of the first conductivity type, and
a gate insulating film is formed between the charge transfer channel and a gate electrode, to have a thickness that becomes smaller in a stepwise fashion in the direction toward the transfer destination of the electric charge.

(5) The imaging element of any of (2) to (4), in which
the charge transfer channel is a charge transfer channel of a first conductivity type that transfers the electric charge of the photoelectric conversion unit of a second conductivity type, the photoelectric conversion unit being formed in a semiconductor of the first conductivity type, and
the charge transfer channel is formed to have an impurity concentration that becomes lower in the direction toward the transfer destination of the electric charge.

(6) The imaging element of (2), in which
the charge transfer channel is a charge transfer channel of a second conductivity type that transfers the electric charge of the photoelectric conversion unit of the second conductivity type, the photoelectric conversion unit being formed in a semiconductor of a first conductivity type, and
a gate insulating film is formed between the charge transfer channel and a gate electrode, to have a thickness that becomes gradually greater in the direction toward the transfer destination of the electric charge.

(7) The imaging element of (2), in which
the charge transfer channel is a charge transfer channel of a second conductivity type that transfers the electric charge of the photoelectric conversion unit of the second conductivity type, the photoelectric conversion unit being formed in a semiconductor of a first conductivity type, and
a gate insulating film is formed between the charge transfer channel and a gate electrode, to have a thickness that becomes greater in a stepwise fashion in the direction toward the transfer destination of the electric charge.

(8) The imaging element of any of (2), (6), and (7), in which
the charge transfer channel is a charge transfer channel of a second conductivity type that transfers the electric charge of the photoelectric conversion unit of the second conductivity type, the photoelectric conversion unit being formed in a semiconductor of a first conductivity type, and
the charge transfer channel is formed to have an impurity concentration that becomes higher in the direction toward the transfer destination of the electric charge.

(9) The imaging element of any of (1) to (8), in which the potential has a gradient in a rotational direction along a gate electrode in the charge transfer channel.

(10) The imaging element of (9), in which the thickness of a gate insulating film formed between the charge transfer channel and the gate electrode varies in the rotational direction.

(11) The imaging element of (9) or (10), in which the impurity concentration in the charge transfer channel varies in the rotational direction.

(12) An imaging device including:

an imaging element including a vertical transistor that has a potential with a gradient in at least part of a charge transfer channel that transfers electric charge of a photoelectric conversion unit; and an image processing unit that performs image processing on captured image data obtained by the imaging element.

(13) A manufacturing apparatus that manufactures an imaging element, the manufacturing apparatus including a vertical transistor manufacturing unit that manufactures a vertical transistor having a potential with a gradient in at least part of a charge transfer channel that transfers electric charge of a photoelectric conversion unit.

(14) The manufacturing apparatus of (13), in which the vertical transistor manufacturing unit includes:

an etching unit that forms a groove by etching a semiconductor substrate;

a conductive impurity implantation unit that implants a conductive impurity into the groove formed by the etching unit;

a gate insulating film formation unit that forms a gate insulating film in the groove, the gate insulating film having a thickness corresponding to a hierarchical level in the groove;

a gate insulating film removal unit that removes the gate insulating film formed by the gate insulating film formation unit, until reaching a depth corresponding to the hierarchical level; and a gate electrode formation unit that forms a gate electrode in a groove formed in the gate insulating film, and the vertical transistor manufacturing unit forms the gate insulating film having a thickness that varies in a stepwise fashion in the direction toward the transfer destination of the electric charge, by repeating the formation of the gate insulating film with the gate insulating film formation unit and the removal of the gate insulating film with the gate insulating film removal unit.

(15) The manufacturing apparatus of (13), in which the vertical transistor manufacturing unit includes:

an etching unit that forms a groove by etching a semiconductor substrate;

a conductive impurity implantation unit that implants a conductive impurity into the groove formed by the etching unit;

a gate insulating film formation unit that forms a gate insulating film in the groove;

a gate insulating film processing unit that forms a mesa-type groove in the gate insulating film formed by the gate insulating film formation unit; and a gate electrode formation unit that forms a gate electrode in the mesa-type groove formed by the gate insulating film processing unit.

(16) The manufacturing apparatus of (13), in which the vertical transistor manufacturing unit includes:

an etching unit that forms a groove by etching a semiconductor substrate;

a conductive impurity implantation unit that implants a conductive impurity into the groove formed by the etching unit;

a non-conductive impurity implantation unit that implants a non-conductive impurity into the groove formed by the etching unit, the non-conductive impurity being implanted at a concentration corresponding to a depth;

a gate insulating film formation unit that forms a gate insulating film in the groove; and a gate electrode formation unit that forms a gate electrode in a groove formed in the gate insulating film.

(17) The manufacturing apparatus of any of (13) to (16), in which the vertical transistor manufacturing unit includes:

an etching unit that forms a groove by etching a semiconductor substrate;

a conductive impurity implantation unit that implants a conductive impurity into the groove formed by the etching unit, the conductive impurity being implanted at a concentration corresponding to a depth;

a gate insulating film formation unit that forms a gate insulating film in the groove; and a gate electrode formation unit that forms a gate electrode in a groove formed in the gate insulating film.

(18) The manufacturing apparatus of any of (13) to (17), in which the vertical transistor manufacturing unit includes:

an etching unit that forms a groove by etching a semiconductor substrate;

a conductive impurity implantation unit that implants a conductive impurity into the groove formed by the etching unit;

a gate insulating film formation unit that forms a gate insulating film in the groove;

a gate insulating film processing unit that forms a groove in the gate insulating film formed by the gate insulating film formation unit, the thickness of the gate insulating film varying in a rotational direction along a gate electrode; and a gate electrode formation unit that forms the gate electrode in the groove formed by the gate insulating film processing unit.

(19) The manufacturing apparatus of any of (13) to (18), in which the vertical transistor manufacturing unit includes:

an etching unit that forms a groove by etching a semiconductor substrate;

a conductive impurity implantation unit that implants a conductive impurity into the groove formed by the etching unit, the conductive impurity being implanted at a concentration corresponding to a position in a rotational direction along a gate electrode;

a gate insulating film formation unit that forms a gate insulating film in the groove; and a gate electrode formation unit that forms the gate electrode in a groove formed in the gate insulating film.

(20) A manufacturing method implemented in a manufacturing apparatus that manufactures an imaging element, the manufacturing method including manufacturing a vertical transistor having a potential with a gradient in at least part of a charge transfer channel that transfers electric charge of a photoelectric conversion unit.

REFERENCE SIGNS LIST

100 Image sensor
110 Semiconductor substrate layer
111 Semiconductor substrate
112 Photoelectric conversion unit
114 Floating diffusion layer
115 Insulating film 120 Transfer transistor
121 Charge transfer channel
122 Gate insulating film
123 Gate electrode
124 Floating diffusion layer
130 Interconnect layer
131 Interconnect line
141 Insulating film
142 Organic photoelectric conversion film
143 Lower transparent electrode
144 Upper transparent electrode
145 Through electrode
146 Contact
151 Passivation layer
152 On-chip lens
171 Charge transfer channel
200 Manufacturing apparatus
201 Control unit
202 Image sensor manufacturing unit
211 Input unit
212 Output unit
213 Storage unit
214 Communication unit
215 Drive
221 Removable medium
231 Vertical transistor manufacturing unit
241 Mask formation unit
242 Etching unit
243 Conductive impurity implantation unit
244 Mask removal unit
245 Gate insulating film deposition unit
246 Gate insulating film processing unit
247 Gate electrode formation unit
251 Non-conductive impurity implantation unit
600 Imaging device
612 CMOS sensor

What is claimed is:

1. An imaging element, comprising:
a pixel including:
   a substrate;
   a photoelectric conversion unit disposed in the substrate;
   a vertical transistor configured to have a potential with a gradient in at least part of a charge transfer channel for transferring electric charge of the photoelectric conversion unit;
   an organic photoelectric conversion film on a first surface of the substrate such that light incident to the photoelectric conversion unit passes through the organic photoelectric conversion film;
   a floating diffusion region that stores charge generated by the organic photoelectric conversion film;
   an insulating film adjacent to the photoelectric conversion unit and that passes through the substrate between the photoelectric conversion unit and the floating diffusion region;
   an interlayer insulating film on a second surface of the substrate opposite the first surface;
   an interconnect line disposed in the interlayer insulating film;
   a contact electrically connected between the floating diffusion region and the interconnect line; and
   a through electrode disposed in the insulating film and electrically connected to the interconnect line to transfer charge generated by the organic photoelectric conversion film to the floating diffusion region.

2. The imaging element according to claim 1, wherein the potential has the gradient in a charge transfer direction in the charge transfer channel, the gradient becoming larger in a direction toward a transfer destination of the electric charge.

3. The imaging element according to claim 2, wherein
the charge transfer channel transferring the electric charge of the photoelectric conversion unit has a first conductivity type, the photoelectric conversion unit has a second conductivity type, and
a gate insulating film is formed between the charge transfer channel and a gate electrode of the vertical transistor, the gate insulating film having a thickness that becomes gradually smaller in the direction toward the transfer destination of the electric charge.

4. The imaging element according to claim 2, wherein
the charge transfer channel transferring the electric charge of the photoelectric conversion unit has a first conductivity type, the photoelectric conversion unit has a second conductivity type, and
a gate insulating film is formed between the charge transfer channel and a gate electrode of the vertical transistor, the gate insulating film having a thickness that becomes smaller in a stepwise fashion in the direction toward the transfer destination of the electric charge.

5. The imaging element according to claim 2, wherein
the charge transfer channel transferring the electric charge of the photoelectric conversion unit has a first conductivity type, the photoelectric conversion unit has a second conductivity type, and
the charge transfer channel is formed to have an impurity concentration of the first conductivity type that becomes lower in the direction toward the transfer destination of the electric charge.

6. The imaging element according to claim 2, wherein
the charge transfer channel transferring the electric charge of the photoelectric conversion unit has a first conductivity type, the photoelectric conversion unit has the first conductivity type, and
a gate insulating film is formed between the charge transfer channel and a gate electrode of the vertical transistor, the gate insulating film having a thickness that becomes gradually greater in the direction toward the transfer destination of the electric charge.

7. The imaging element according to claim 2, wherein
the charge transfer channel transferring the electric charge of the photoelectric conversion unit has a first conductivity type, the photoelectric conversion unit has the first conductivity type, and
a gate insulating film is formed between the charge transfer channel and a gate electrode of the vertical transistor, the gate insulating film having a thickness that becomes greater in a stepwise fashion in the direction toward the transfer destination of the electric charge.

8. The imaging element according to claim 2, wherein
the charge transfer channel transferring the electric charge of the photoelectric conversion unit has a first conductivity type, the photoelectric conversion unit has the first the first conductivity type, and
the charge transfer channel is formed to have an impurity concentration that becomes higher in the direction toward the transfer destination of the electric charge.

9. The imaging element according to claim 1, wherein the potential has the gradient in a rotational direction along a gate electrode of the vertical transistor in the charge transfer channel.

10. The imaging element according to claim 9, wherein a thickness of a gate insulating film formed between the charge transfer channel and the gate electrode varies in the rotational direction.

11. The imaging element according to claim 9, wherein an impurity concentration in the charge transfer channel varies in the rotational direction.

12. An imaging device comprising:
an optical unit;
an imaging element including a pixel, the pixel including:
    a substrate;
    a photoelectric conversion unit disposed in the substrate;
    a vertical transistor configured to have a potential with a gradient in at least part of a charge transfer channel for transferring electric charge of the photoelectric conversion unit;
    an organic photoelectric conversion film on a first surface of the substrate such that light incident to the photoelectric conversion unit passes through the organic photoelectric conversion film;
    a floating diffusion region that stores charge generated by the organic photoelectric conversion film;
    an insulating film adjacent to the photoelectric conversion unit and that passes through the substrate between the photoelectric conversion unit and the floating diffusion region;
    an interlayer insulating film on a second surface of the substrate opposite the first surface;
    an interconnect line disposed in the interlayer insulating film;
    a contact electrically connected between the floating diffusion region and the interconnect line; and
    a through electrode disposed in the insulating film and electrically connected to the interconnect line to transfer charge generated by the organic photoelectric conversion film to the floating diffusion region; and
an image processing circuit configured to perform image processing on captured image data obtained by the imaging element.

13. The imaging device according to claim 12, wherein the potential has the gradient in a charge transfer direction in the charge transfer channel, the gradient becoming larger in a direction toward a transfer destination of the electric charge.

14. The imaging device according to claim 13, wherein the charge transfer channel transferring the electric charge of the photoelectric conversion unit has a first conductivity type, the photoelectric conversion unit has a second conductivity type, and
a gate insulating film is formed between the charge transfer channel and a gate electrode of the vertical transistor, the gate insulating film having a thickness that becomes gradually smaller in the direction toward the transfer destination of the electric charge.

15. The imaging device according to claim 13, wherein the charge transfer channel transferring the electric charge of the photoelectric conversion unit has a first conductivity type, the photoelectric conversion unit has a second conductivity type, and
a gate insulating film is formed between the charge transfer channel and a gate electrode of the vertical transistor, the gate insulating film having a thickness that becomes smaller in a stepwise fashion in the direction toward the transfer destination of the electric charge.

16. The imaging device according to claim 13, wherein the charge transfer channel transferring the electric charge of the photoelectric conversion unit has a first conductivity type, the photoelectric conversion unit has a second conductivity type, and
the charge transfer channel is formed to have an impurity concentration that becomes lower in the direction toward the transfer destination of the electric charge.

17. The imaging device according to claim 13, wherein the charge transfer channel transferring the electric charge of the photoelectric conversion unit has a first conductivity type, the photoelectric conversion unit has the first the first conductivity type, and
a gate insulating film is formed between the charge transfer channel and a gate electrode of the vertical transistor, the gate insulating film having a thickness that becomes gradually greater in the direction toward the transfer destination of the electric charge.

18. The imaging device according to claim 13, wherein the charge transfer channel transferring the electric charge of the photoelectric conversion unit has a first conductivity type, the photoelectric conversion unit has the first conductivity type, and
a gate insulating film is formed between the charge transfer channel and a gate electrode of the vertical transistor, the gate insulating film having a thickness that becomes greater in a stepwise fashion in the direction toward the transfer destination of the electric charge.

19. The imaging device according to claim 13, wherein the charge transfer channel transferring the electric charge of the photoelectric conversion unit has a first conductivity type, the photoelectric conversion unit has the first conductivity type, and
the charge transfer channel is formed to have an impurity concentration that becomes higher in the direction toward the transfer destination of the electric charge.

20. The imaging device according to claim 12, wherein the potential has the gradient in a rotational direction along a gate electrode of the vertical transistor in the charge transfer channel.

* * * * *